United States Patent
Takada et al.

(10) Patent No.: US 7,339,118 B1
(45) Date of Patent: Mar. 4, 2008

(54) PRINTED WIRING BOARD AND METHOD FOR MANUFACTURING THE SAME

(75) Inventors: Masaru Takada, Ogaki (JP); Hisashi Minoura, Ogaki (JP); Kiyotaka Tsukada, Ogaki (JP); Hiroyuki Kobayashi, Ogaki (JP); Mitsuhiro Kondo, Ogaki (JP)

(73) Assignee: Ibiden Co., Ltd., Ogaki-shi, Gifu-Ken (JP)

( * ) Notice: Subject to any disclaimer, the term of this patent is extended or adjusted under 35 U.S.C. 154(b) by 0 days.

(21) Appl. No.: 09/380,994

(22) PCT Filed: Mar. 9, 1998

(86) PCT No.: PCT/JP98/00960

§ 371 (c)(1),
(2), (4) Date: Sep. 13, 1999

(87) PCT Pub. No.: WO98/40914

PCT Pub. Date: Sep. 17, 1998

(30) Foreign Application Priority Data

| Mar. 13, 1997 | (JP) | ................................. 9-082040 |
| Mar. 15, 1997 | (JP) | ................................. 9-082213 |
| Jun. 11, 1997 | (JP) | ................................. 9-171016 |
| Jun. 17, 1997 | (JP) | ................................. 9-177687 |
| Feb. 5, 1998 | (JP) | ................................. 10-041399 |

(51) Int. Cl.
*H05K 1/03* (2006.01)
*H05K 3/36* (2006.01)

(52) U.S. Cl. .......................... 174/255; 29/830; 29/832; 174/262

(58) Field of Classification Search ........ 361/792–795; 174/262–266, 255; 29/830, 832
See application file for complete search history.

(56) References Cited

U.S. PATENT DOCUMENTS

| 4,180,608 | A | * | 12/1979 | Del ............................. 428/196 |
| 4,729,061 | A | * | 3/1988 | Brown ....................... 174/262 |
| 5,010,641 | A | * | 4/1991 | Sisler ......................... 29/830 |
| 5,216,278 | A | | 6/1993 | Lin et al. .................... 257/688 |
| 5,435,877 | A | * | 7/1995 | Ishii et al. .................. 156/264 |
| 5,519,936 | A | | 5/1996 | Andros et al. ............... 29/840 |
| 5,541,368 | A | * | 7/1996 | Swamy ....................... 174/266 |
| 5,576,519 | A | * | 11/1996 | Swamy ....................... 174/265 |

(Continued)

FOREIGN PATENT DOCUMENTS

EP 0376100 7/1990

(Continued)

*Primary Examiner*—Tuan T. Dinh
*Assistant Examiner*—Jeremy C Norris
(74) *Attorney, Agent, or Firm*—Synnestvedt & Lechner LLP

(57) ABSTRACT

In a printed wiring board, an odd number (n) of conductive layers (11-13) and insulating layers (21-23) are alternately laminated upon each other. The first conductive layer (11) is a parts connecting layer and the n-th conductive layer (13) is an external connecting layer which is connected to external connecting terminals (7). The second to (n−1)-th conductive layers (12) are current transmitting layers for transmitting internal currents. The surface of the n-th insulating layer (23) in a state where the external connecting terminals (7) are exposed on the surface. It is preferable to make the initial insulating layers of a glass-cloth reinforced prepreg and the external insulating layers of a resin.

9 Claims, 29 Drawing Sheets

U.S. PATENT DOCUMENTS

| | | | |
|---|---|---|---|
| 5,583,376 A | 12/1996 | Sickler et al. | 257/702 |
| 5,583,378 A | 12/1996 | Marrs et al. | 257/710 |
| 5,636,104 A | 6/1997 | Oh | 361/777 |
| 5,670,250 A * | 9/1997 | Sanville et al. | 428/323 |
| 5,734,560 A * | 3/1998 | Kamperman et al. | 361/774 |
| 5,744,758 A * | 4/1998 | Takenouchi et al. | 174/255 |
| 5,764,485 A * | 6/1998 | Lebaschi | 361/774 |
| 5,796,163 A * | 8/1998 | Glenn et al. | |
| 6,006,428 A * | 12/1999 | Feilchenfeld et al. | 29/852 |
| 6,132,853 A * | 10/2000 | Noddin | 428/209 |
| 6,208,525 B1 * | 3/2001 | Imasu et al. | 361/783 |
| 6,461,896 B1 * | 10/2002 | Imasu et al. | 438/108 |

FOREIGN PATENT DOCUMENTS

| | | |
|---|---|---|
| EP | 0 692 823 | 1/1996 |
| EP | 0 713 359 | 5/1996 |
| JP | 61-174193 | 8/1986 |
| JP | 3-244194 | 10/1991 |
| JP | 5-335440 | 12/1993 |
| JP | 7-115272 | 5/1995 |
| JP | 07-283538 | 10/1995 |
| JP | 8-31979 | 2/1996 |
| JP | 08-070183 | 3/1996 |
| JP | 08-148824 | 6/1996 |
| JP | 8-186373 | 7/1996 |
| JP | 8-193139 | 7/1996 |
| JP | 8-279571 | 10/1996 |
| JP | 8-298298 | 11/1996 |
| JP | 08-330356 | 12/1996 |
| JP | 08-335781 | 12/1996 |
| JP | 09-008458 | 1/1997 |
| KR | 96-42902 | 12/1996 |

* cited by examiner

PRINTED WIRING BOARD AND METHOD FOR MANUFACTURING THE SAME

BACKGROUND OF THE INVENTION

The present invention relates generally to a multilayered printed wiring board capable of realizing high-density packaging and a method for manufacturing the same, and particularly to a printed wiring board having an odd number of conductive layers, a printed wiring board having build-up layers formed by using the additive method and the like, a method of forming interconnecting through holes for electrically connecting conductive layers and narrowing the pitch between solder balls for external connection and the interconnecting through holes.

Conventional printed wiring boards include those having conductive layers 911 to 914 built up successively, as shown in FIG. 42. The conductive layers 911 to 914 are electrically connected to one another via interconnecting through holes 931 to 933. Insulating layers 921 to 923 are interposed between the conductive layers 911 to 914, respectively.

The conductive layer 911 is a component-connecting layer on which an electronic component 961 is mounted and conducts electric currents in and out of the electronic component 961. The conductive layer 911 which is one of the outermost layers and the electronic component 931 are electrically connected to each other by bonding wires 962. The conductive layer 914 which is the other outermost layer serves as an external connecting layer for connecting external connecting terminals 97 and leading electric currents in and out of a printed wiring board 941. The internal conductive layers 912 and 913 are electric current transmitting layers for transmitting internal currents of the printed wiring board 941.

Next, the method of manufacturing the above printed wiring board will be described.

First, as shown in FIG. 43, conductive layers 912 and 913 are formed on the upper side and lower side of an insulating layer 922 respectively. Further, interconnecting through holes 932 are formed through the insulating layer 922, and the wall of each interconnecting through hole 932 is covered with a metal plating film 95. A resin 92 is then packed in the interconnecting through holes 932.

Next, an insulating layer 921 and a copper foil are laminated on the upper side of the insulating layer 922, while an insulating layer 923 and a copper foil are laminated on the lower side, followed by etching of the copper foils to form conductive layers 911 and 914.

Subsequently, as shown in FIG. 44, interconnecting through holes 931 and 933 are formed through the insulating layers 921 and 923 to expose the surfaces of the internal conductive layers 912 and 913, respectively.

Then, as shown in FIG. 42, a metal plating film 95 is formed on the walls of the interconnecting through holes 931 and 933, and external connecting terminals 97 are bonded onto the surface of the outermost conductive layer 914.

Thus, the printed wiring board 941 can be obtained.

By repeating the procedures shown in FIGS. 43 and 44, the number of conductive layers to be built up in the printed wiring board 941 can be increased. The thus obtained printed wiring board has insulating layers and conductive layers built up alternately both on the upper side and on the lower side of the center insulating layer 922. Therefore, an even number of conductive layers are formed according to the above method.

However, the conventional method of manufacturing printed wiring boards as described above is not suitable for building up an odd number of conductive layers, although it can build up an even number of conductive layers efficiently.

To describe, for example, a case where a printed wiring board having five conductive layers 910 to 914 built up, as shown in FIG. 45, is manufactured, the second to fifth conductive layers 911 to 914 are built up first, as shown in FIG. 46, in the same manner as described above, except that the conductive layer 914 is an unpatterned copper foil.

Next, as shown in FIG. 47, the conductive layer 914 is removed completely, and then interconnecting through holes 931 are formed, as shown in FIG. 48, followed by formation of a metal plating film 95 on the wall of each through hole 931. Subsequently, as shown in FIG. 49, prepregs are laminated and press-bonded to form insulating layers 920 and 924. Conductive layers 910 and 941 are then formed on the surfaces of the insulating layers 920 and 924 respectively, followed by formation of interconnecting through holes 930 and 933 through the insulating layers 920 and 924 respectively, as shown in FIG. 50. A metal plating film 95 is formed on the walls of the through holes 930 and 933, as shown in FIG. 45.

As described above, when a printed wiring board having an odd number of conductive layers is manufactured, it is necessary, in order to prevent warping of the press-bonded printed wiring board from occurring, to carry out, after formation of the internal conductive layers 911 and 914, the procedure of removing the conductive layer 914. Thus, the conventional method requires wasteful a procedure and is an extremely inefficient manufacturing method. Further, the insulating layers formed are too thick to meet the purpose of achieving downsizing of printed wiring boards.

Under such circumstances, it can be considered to form an insulating layer 920 and a conductive layer 910 only on one side of the insulating layer 921. In this case, however, warping of the printed wiring board can occur in the step of press-bonding a prepreg for forming the insulating layer 920.

Meanwhile, in a multilayer build-up type printed wiring board, the internal insulating layers 921 and 923 to be embedded in it are resins, so that they have high coefficients of water absorption of 0.5 to 1.0% and have high water contents. The water is vaporized naturally with passage of time to assume the form of water vapor which collects mainly, for example, between the insulating layer 921 and the adjacent insulating layers 922 and 920 and between the insulating layer 923 and the adjacent insulating layers 922 and 924.

Accordingly, it is likely that the interlayer adhesion is lowered and that the layers undergo delamination. Particularly, the greater the number of layers laminated, the greater becomes the number of water-containing internal insulating layers, and the higher becomes the tendency of interlayer delamination.

Meanwhile, referring to manufacturing of printed wiring boards, there is a method invented by us previously and disclosed in Japanese Patent Application No. Hei 8-21975. That is, as shown in FIG. 51, a conductive layer is formed on each insulating layer in step S91, and then interconnecting through hole-forming through holes are defined in each insulating layer in step S92. Steps S91 and S92 are repeated corresponding to the number n of insulating layers to be laminated. Next, in step S93, the number n of insulating layers are laminated via an adhesive material and positioned such that the through holes in the respective layers may communicate with one another to constitute interconnecting through holes. In step S94, the adhesive material is melted by heating and the like, and the layers are press-bonded together to form a multilayer substrate. In step S95, a conductive material, such as a solder and the like is packed into the interconnecting through holes to impart conductivity to them. Thus, a printed wiring board is obtained.

However, in the conventional method of manufacturing printed wiring boards described above, interconnecting through hole-forming through holes must be defined in each insulating layer independently. Accordingly, the method requires intricate procedures of defining through holes. Further, the through holes must be positioned. Particularly, with the reduction in the size of the interconnecting through holes, it is becoming difficult to carry out accurate registration of the through holes.

Meanwhile, in a multilayer printed wiring board, pads for connecting external terminals such as solder balls are provided on the outermost layer. In this case, the interconnecting through holes must be electrically connected with the pads by connecting circuits. However, the connecting circuits which occupy a large surface area are a hindrance in achieving high-density packaging on the substrate surface. Particularly, in a multilayer printed wiring board, it is necessary to form high-density wiring on the uppermost surface. Further, large amounts of electric currents must fed in and out through the external connecting terminals.

The present invention is directed, in view of the problems inherent in the prior art described above, to provide a printed wiring board which can improve electrical properties of multilayered wiring boards and a method for manufacturing the same. Particularly, it is a first objective of the present invention to build up an odd number of conductive layers efficiently with no warping. A second objective of the present invention is to prevent delamination of layers. A third objective of the present invention is to form interconnecting through holes at accurate positions. A fourth objective of the present invention is to carry out transference of a huge amount of electrical information through solder balls for external connection and also to achieve high densification of surface packaging.

SUMMARY OF THE INVENTION

A first aspect of the present invention is a printed wiring board having an odd number n of conductive layers which are built up via insulating layers respectively and which are electrically connected to one another by interconnecting through holes, characterized in that the first conductive layer is a component-connecting layer on which an electronic component is to be mounted and which leads electric currents in and out of the electronic component. The n-th conductive layer is an external connecting layer for connecting external connecting terminals for leading currents in and out of the printed wiring board. The second to (n−1)-th conductive layers are current transmitting layers for transmitting internal currents of the printed wiring board, and the surface of the n-th conductive layer is covered with the n-th and outermost insulating layer which is the outermost layer with the external connecting terminals being exposed.

What is noticeable most in the first aspect of the invention is that the printed wiring board has an odd number n of conductive layers and the surface of the n-th conductive layer is covered with the n-th and outermost insulating layer with the external connecting terminals being exposed.

In the first aspect of the invention, the odd number n means an integer excluding 1, which cannot be divided by 2 into a numeral with no decimal fraction, for example, 3, 5 and 7. The reason why 1 is excluded from the odd number n is that such a constitution having only one conductive layer cannot constitute a printed wiring board.

Actions and effects of the first aspect of the invention will be described.

The printed wiring board according to the first aspect of the invention has an odd number n of conductive layers formed between an odd number n of insulating layers respectively. The (n+1)/2-th insulating layer is a central insulating layer and has on the upper side and lower side the same number of insulating layers respectively. Accordingly, no warping occurs in the printed wiring board during press-bonding of prepregs for forming insulating layers.

Further, conductive layers can be built up on the upper side and lower side of the central insulating layer efficiently.

Therefore, the printed wiring board according to the first aspect of the invention is of the structure which facilitates building up of an odd number n of conductive layers.

Further, the n-th and last conductive layer is covered with the n-th and outermost insulating layer serving as the outermost layer. Accordingly, the n-th conductive layer is embedded in the printed wiring board. However, the external connecting terminals connected to the n-th conductive layer are exposed through connecting holes of the n-th insulating layer, so that electric currents can be led in and out of the printed wiring board through the external connecting terminals.

The external connecting terminals are preferably solder balls. The solder balls can stably lead electric currents in and out through the n-th conductive layer.

It is also possible to connect external connecting terminals to the surface of the n-th conductive layer and to build up an (n+1)-th conductive layer on the surface of the n-th insulating layer present on the n-th conductive layer. In this case, the resulting printed wiring board comes to have an even number of conductive layers. External connecting terminals can be connected to the surface of the (n+1)-th conductive layer.

The method of manufacturing the above printed wiring board can be exemplified as follows: a method of manufacturing a printed wiring board having an odd number n of conductive layers which are built up via insulating layers respectively and are electrically connected to one another via interconnecting through holes. The method comprising the steps of: interposing insulating layers between second to n-th conductive layers respectively and also forming interconnecting through holes for electrically connecting the conductive layers to one another; laminating a prepreg and a copper foil on the surface of the second conductive layer, while laminating and press-bonding a prepreg on the surface of the n-th conductive layer to form a multilayer substrate having an odd number n of insulating layers and also locating the second to n-th conductive layers as internal layers of the multilayer substrate; etching the copper foil to form a first conductive layer; forming interconnecting through holes and connecting holes in the first insluting layer and in the n-th insulating layer respectively; forming a metal plating film for electrically connecting the first conductive layer with the second conductive layer on the walls of the interconnecting through holes of the first insulating layer; and connecting external connecting terminals to the surface of the n-th conductive layer exposed through the interconnecting through holes of the n-th insulating layer.

What is most noticeable in this method is that a prepreg and a copper foil for forming the first conductive layer are laminated on the surface of the second conductive layer and that only a prepreg is laminated on the surface of the n-th conductive layer. When the prepregs and the copper foil are press-bonded, the first insulating layer and the n-th insulating layer are formed simultaneously by this press-bonding. Accordingly, the second to (n−1)-th insulating layers already laminated into a single body receive, on the upper sides and the lower sides, thermal stress evenly from the prepregs during the press-bonding, so that no warping occurs in the printed wiring board.

Further, the n-th and last conductive layer is covered on the surface with an insulating layer formed by laminating and press-bonding a prepreg. In this state, no electric current can be led in and out through the n-th conductive layer. However, connecting holes are defined in the outermost insulating layer to expose the external connecting terminals through these connecting holes, and thus electric currents can be led in and out through the n-th and last conductive layer.

In addition, the external connecting terminals are preferably solder balls. The solder balls can lead stably electric currents in and out through the n-th conductive layer.

The conductive layers referred to above mean all sorts of conductive patterns which can be formed on the surfaces of insulating substrates, for example, wiring circuits, pads, terminals and lands. Conductive patterns are formed, for example, by etching metal foils or by metal plating.

The insulating layers include synthetic resin single substances, prepregs, etc. The synthetic resins include, for example, epoxy resins, phenol resins, polyimide resins, polybutadiene resins and fluororesins.

Further, the printed wiring board according to the first aspect of the invention can be utilized, for example, as memory modules, multichip modules, mother boards, daughter boards and plastic packages.

Methods of defining interconnecting through holes and connecting holes include, for example, irradiation of laser beams onto the insulating layers at the positions where holes are to be formed; chemical melting of the insulating layer at the positions where holes are to be formed; and machining using a drill.

A second aspect of the present invention is a printed wiring board comprising an internal insulating substrate having a conductor circuit formed on the surface, at least one internal insulating layer laminated on the surface of the internal insulating substrate, and an external insulating layer laminated on the surface of the internal insulating layer, the internal insulating layer and the external insulating layer having an internal conductor circuit and an external conductor circuit respectively; wherein the internal insulating layer is of a glass cloth-reinforced prepreg; and the external insulating layer is of a resin.

The glass cloth-reinforced prepreg referred to above means a material obtained by impregnating a glass cloth base material with a resin. However, in the second aspect of the invention, it is particularly preferred to use a prepreg containing 30 to 70% by weight of glass cloth. Thus, the coefficient of water absorption can be lowered to prevent interlayer delamination from occurring. Meanwhile, those prepregs which contain less than 30% by weight of glass cloth come to have high coefficient of water absorption to be liable to undergo interlayer delamination, whereas those which contain more than 70% by weight of glass cloth is likely to show low interlayer adhesion, since the absolute amount of resin is small.

Further, the outermost insulating layer may be formed using the same prepreg as used for the internal insulating layers.

It should be noted that in the printed wiring board according to the second aspect of the invention, interconnecting through holes, blind via holes, via holes, etc. can be formed in the internal insulating substrate, internal insulating layer(s) and external insulating layer. Further, on the external insulating layer, lands for mounting solder balls, a solder resist for securing insulation between external conductor circuits, etc. can be formed. That is, the printed wiring board according to the second aspect of the invention may have various structures generally employed in printed wiring boards.

Actions of the second aspect of the present invention will be described below.

In the printed wiring board according to the second aspect of the invention, a glass cloth-reinforced prepreg constitutes the internal insulating layer, while a resin constitutes the external insulating layer. That is, since the internal insulating layer contains the glass cloth, coefficient of water absorption can be reduced in the layer. Accordingly, the coefficient of water absorption of the internal insulating layer as a whole can be reduced.

Therefore, the absolute amount of water to be contained in the internal insulating layer is reduced, in turn, the absolute amount of water vapor to be formed by vaporization of the water content is reduced. Thus, the amount of water vapor collecting between the layers is reduced, increasing interlayer adhesion.

That is, the printed wiring board according to the second aspect of the invention has a highly reliable structure, since it hardly undergoes interlayer delamination.

Further, since the external insulating layer is of a resin, it facilitates formation of fine patterns. Therefore, the printed wiring board according to the second aspect of the invention facilitates formation of a high-density substrate.

As described above, according to the second aspect of the invention, printed wiring boards which hardly undergo interlayer delamination and can maintain high reliability even if the printed wiring board is allowed to have a higher multilayer structure, can be provided.

Further, the printed wiring board according to the second aspect of the invention can be utilized, for example, as memory modules, multichip modules, mother boards, daughter boards and plastic packages.

It is preferred to form two or more internal insulating layers. According to this structure, printed wiring boards having higher multilayer structures and high reliability can be obtained.

The coefficient of water absorption in the internal insulating layer is preferably 0.1 to 0.3%. Thus, the effects to be brought about according to the second aspect of the invention can be secured. It is difficult to form such prepregs as having coefficients of water absorption of less than 0.1%; whereas prepregs having coefficients of water absorption of more than 0.3% contain too much water to exhibit the effect to be brought about according to the second aspect of the invention.

A third aspect of the invention is a method of manufacturing a printed wiring board having a plurality of conductive layers which are built up via insulating layers respectively and are electrically connected to one another via interconnecting through holes. The method comprises the steps of forming conductive layers on a plurality of insulating layers respectively; laminating and press-bonding the resulting insulating layers to form a multilayer substrate; irradiating a laser beam upon the multilayer substrate at interconnecting through hole-forming portions to define interconnecting through holes such that the bottoms of these through holes reach the conductive layers; fusing solder balls against the interconnecting through holes and filling them with the solder.

Actions and effects of the third aspect of the invention will be described.

In the third aspect of the invention, after the insulating layers are laminated, a laser beam is irradiated to form interconnecting through holes. Accordingly, interconnecting through holes penetrating all of the insulating layers are formed by a single hole-defining procedure. Further, there is no need of forming interconnecting through hole-defining through holes in the respective insulating layers independently, facilitating formation of interconnecting through holes.

Furthermore, according to the third aspect of the invention, interconnecting through holes having different depths can be formed by the single hole-defining procedure.

Unlike the prior art, insulating layers need not be positioned for securing continuity of the through holes. Further, even small interconnecting through holes can be formed accurately.

Further, the interconnecting through holes are filled with a solder, and solder balls are fused to the openings of the interconnecting through holes, so that electric currents flowing across the internal conductive layers can be taken out easily through the solder and solder balls.

The walls of the interconnecting through holes are preferably covered with metal plating films, and thus conductivity can be imparted to these through holes.

The conductive layers preferably have a thickness of 10 to 70 μm. If they have a thickness of less than 10 μm, holes are likely to be formed in the conductive layers by the laser beam irradiation; whereas if they have a thickness of more than 70 μm, patterning of the conductive layers is likely to be difficult.

The insulating layers are preferably flexible films made of a glass fiber-reinforced resin. Such insulating layers facilitate the hole-defining procedures using laser beam, and besides thinning of printed wiring boards can be realized.

As the laser beam 341, for example, a $CO_2$ laser and an eximer laser can be used.

As the insulating layer, for example, synthetic resin single substances, resin base materials containing synthetic resins and inorganic fillers, cloth base materials containing synthetic resins and inorganic cloth, etc. can be used. The synthetic resins include, for example, epoxy resins, phenol resins, polyimide resins, polybutadiene resins and fluororesins. Insulating layers formed using such synthetic resins only are occasionally laminated as prepregs or solder resists between other insulating layers.

Further, the inorganic fillers to be added to the synthetic resins include, for example, glass short fibers, silica powders, mica powders, alumina and carbon. Base materials containing mixtures of synthetic resins and inorganic fillers show high strength compared with those made of synthetic resin single substances.

Meanwhile, the cloth base materials referred to above mean those substrates made of woven or knitted fabric cloth and synthetic resins such as glass-epoxy substrates and glass-polyimide substrates. Such cloth base materials include those obtained by impregnating the cloth with synthetic resins. Further, materials of the cloth include glass-fiber cloth, carbon cloth, aramid cloth, etc. As the synthetic resins those as described above are employed.

The conductive layers referred to above mean conductive patterns which are formed parallel to the surfaces of insulating layers, for example, wiring patterns, pads, lands and terminals. The conductive patterns are formed, for example, by etching metal foils or by metal plating.

The printed wiring board manufactured according to the third aspect of the invention can be utilized, for example, as memory modules, multichip modules, mother boards, daughter boards and plastic packages.

A fourth aspect of the invention is a printed wiring board comprising an interconnecting through hole penetrating an insulating substrate, a covering pad covering one opening of the interconnecting through hole, and a conductor circuit provided along the peripheral edge of the other opening which remains open; wherein the covering pad and the conductor circuit are electrically connected to each other via a metal plating film covering the wall of the interconnecting through hole; and a solder ball for external connection is bonded onto the surface of the covering pad.

Actions and effects of the fourth aspect of the invention will be described.

In the fourth aspect of the invention, one opening of each interconnecting through hole is covered with a covering pad on which a solder ball is bonded. Accordingly, the covering pad for bonding a solder ball can be located substantially in alignment with the interconnecting through hole.

Therefore, the area occupied by the interconnecting through hole coincides with the area occupied for bonding the solder ball, so that there is no need of securing the area for forming interconnecting through holes and the area for bonding solder balls separately, thus achieving high-density packaging of interconnecting through holes and solder balls.

Further, since the areas to be occupied by the interconnecting through holes and solder balls are narrowed to afford extra spaces on the surface of the insulating substrate, conductor circuits and the like can be formed on such extra spaces, enabling high densification of surface packaging on the insulating substrate. Besides, the fourth aspect of the invention fully satisfies the requirements particularly for multilayer build-up type printed wiring boards which require high-density surface packaging.

The solder balls are preferably located in alignment with the central axes of the interconnecting through holes respectively. Since the interconnecting through holes and the solder balls can be aligned respectively, the areas to be occupied by both of them can further be narrowed.

The solder balls may be located at positions offset from the interconnecting through holes respectively. In this case, larger areas are required for bonding solder balls and for forming the interconnecting through holes compared with the case where they are aligned. However, they can be located in small areas compared with the prior art where they are located completely separately.

It is preferred that the surface of the insulating substrate is covered with a solder resist, and also the interconnecting through holes are filled with the solder resist. Thus, the conductor circuit formed on the surface of the insulating substrate and the metal plating films formed on the walls of the interconnecting through holes can be protected from moisture and flawing. The solder ball-connecting portions are not covered with the solder resist but are exposed. In the case where terminal connecting portions for terminals other than solder balls are to be secured, such portions are not covered with the resist but are exposed. The interconnecting through holes may be filled with a filler of conductive materials such as a solder in place of the solder resist.

A fifth aspect of the invention is a printed wiring board comprising an interconnecting through hole penetrating an insulating substrate, an annular pad disposed along the peripheral edge of one opening of the interconnecting through hole so as not to cover the opening, a covering pad covering the other opening of the interconnecting through hole and a conductor circuit connected to the covering pad; wherein the annular pad and the covering pad are electrically connected to each other by a metal plating film covering the wall of the interconnecting through hole; and a solder ball for external connection is bonded onto the surface of the annular pad.

In the fifth embodiment of the invention, an annular pad is located along the peripheral edge of one opening of each interconnecting through hole, and a solder ball is bonded onto the surface of the pad. Accordingly, the solder ball can be located substantially in alignment with the interconnecting through hole. Therefore, the area to be occupied by the interconnecting through hole coincides with the area to be occupied for bonding the solder ball, so that there is no need of securing the area for forming interconnecting through holes and the area for bonding solder balls separately, thus achieving high-density packaging of interconnecting through holes and solder balls.

Further, since the areas to be occupied by the interconnecting through holes and solder balls are narrowed to afford extra spaces on the surface of the insulating substrate, conductor circuits and the like can be formed on such extra spaces, enabling high densification of surface packaging on the insulating substrate.

It is preferred that the solder balls are located in alignment with the central axes of the interconnecting through holes respectively and that each interconnecting through hole is filled with the solder as a lower part of the solder ball. Since the interconnecting through holes and the solder balls can be aligned respectively as described above, the areas to be occupied by both of them can further be narrowed.

The solder balls may be located at positions offset from the interconnecting through holes respectively. In this case, larger areas are required for bonding solder balls and for forming the interconnecting through holes compared with the case where they are aligned. However, they can be located in small areas compared with the prior art where they are located completely separately.

The surface of the insulating substrate is preferably covered with a solder resist. Thus, the conductor circuit formed on the surface of the insulating substrate can be protected from moisture, flawing, etc. The solder ball-connecting portions on the covering pads are not covered with the solder resist but are exposed. In the case where terminal connecting portions for terminals other than solder balls are to be secured, such portions are not covered with the resist but are exposed.

DETAILED DESCRIPTION OF THE INVENTION

First Embodiment

The printed wiring board of the embodiment according to the first aspect of the invention will be explained referring to FIGS. 1 to 9.

Figure 1:
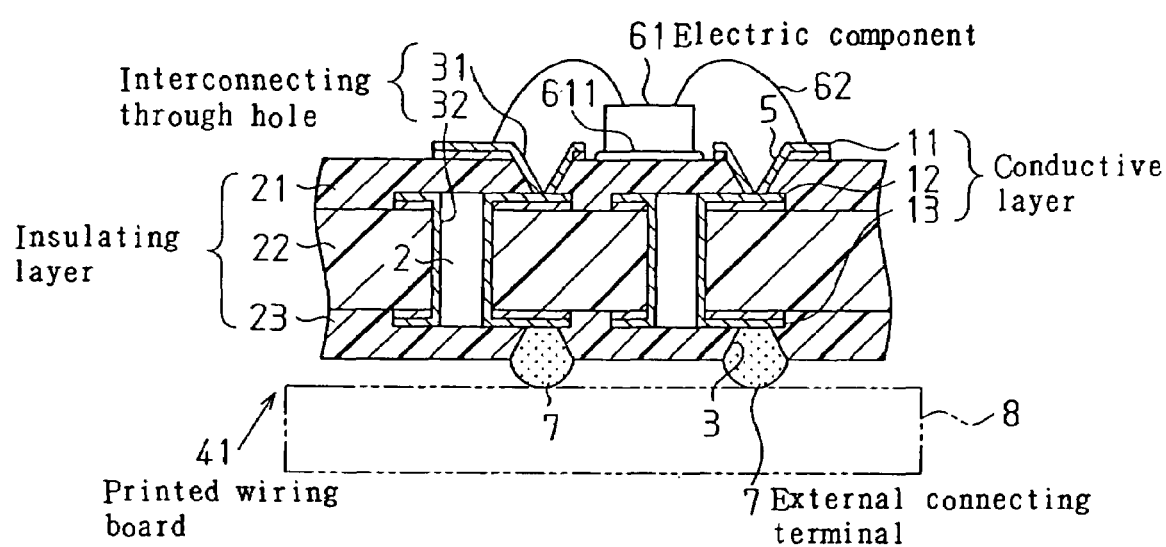
FIG. 1 is a cross-sectional view of the printed wiring board according to a first embodiment of the invention.

The printed wiring board 41 of the first embodiment has three conductive layers 11 to 13 which are built up via insulating layers 21 to 23 respectively, as shown in FIG. 1. The conductive layers 11 to 13 are electrically connected to one another by interconnecting through holes 31 and 32.

The first conductive layer 11 is a component connecting layer on which an electronic component 61 is mounted and leads electric currents in and out of the component 61.

The second conductive layer 12 is an electric current transmitting layer for transmitting internal electric currents of the printed wiring board 41.

The third conductive layer 13 is an external connecting layer for connecting external connecting terminals 7 for leading electric currents in and out of the printed wiring board 41. The surface of the third and outermost conductive layer 13 is covered with the third insulating layer 23 with the external connecting terminals 7 being exposed. The external connecting terminals 7 are solder balls.

Next, the method of manufacturing the above printed wiring board will be described.

Figure 2:
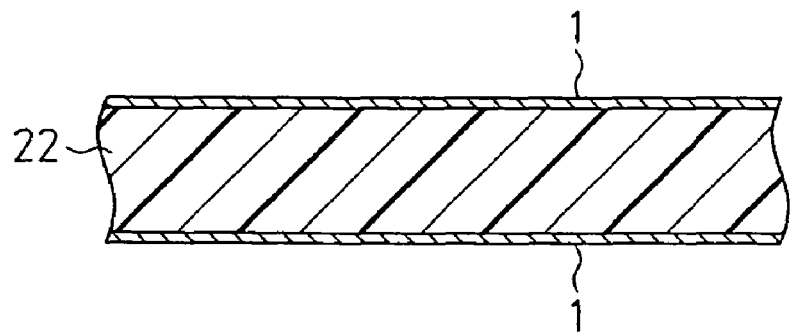
FIG. 2 is a cross-sectional view of an insulating layer in the method of manufacturing the printed wiring board of the first embodiment.
Figure 3:
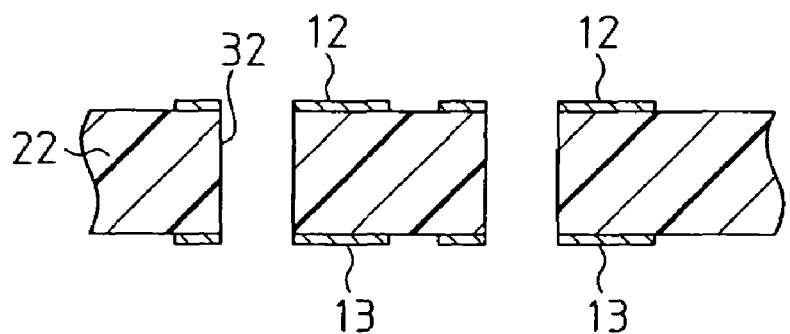
FIG. 3 is a cross-sectional view continuing from FIG. 2 showing a second insulating layer containing interconnecting through holes.

First, as shown in FIG. 2, copper foils 1 are bonded to the upper side and lower side of the second insulating layer 22, and then interconnecting through holes 32 are formed through the insulating layer 22 and the copper foils 1 by drilling, followed by etching of the copper foils 1 to form conductive layers 12 and 13, as shown in FIG. 3.

Figure 4:
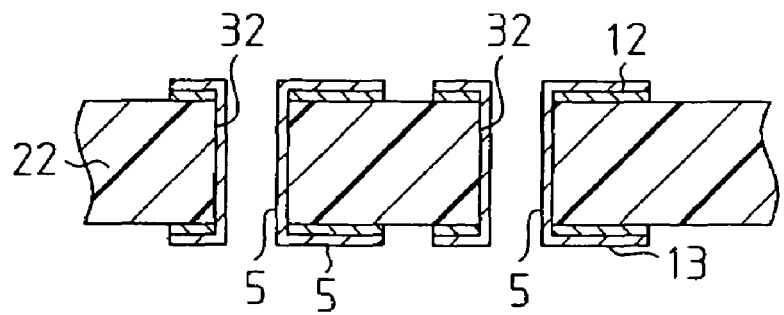
FIG. 4 is a cross-sectional view continuing from FIG. 3 showing the second insulating layer in which a metal plating film is formed on the walls of the interconnecting through holes.

Subsequently, as shown in FIG. 4, the wall of each interconnecting through hole 32 is subjected to chemical copper plating and electric copper plating to form a metal plating film 5. In this step, the surfaces of the conductive layers 12 and 13 are covered with the metal plating films 5.

Figure 5:
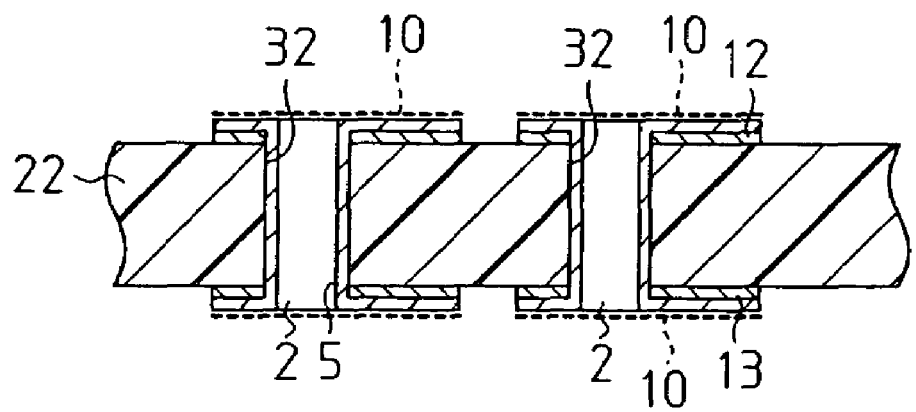
FIG. 5 is a cross-sectional view continuing from FIG. 4 showing the second insulating layer on which a black oxide film is formed.

Next, as shown in FIG. 5, a resin paste 2 is packed into the interconnecting through holes 32 by means of printing, and then black oxide films 10 are formed on the surfaces of the conductive layers 12 and 13. The black oxide films 10 are formed so as to enhance adhesion between the conductive layers and insulating layers to be laminated thereon respectively.

Figure 6:
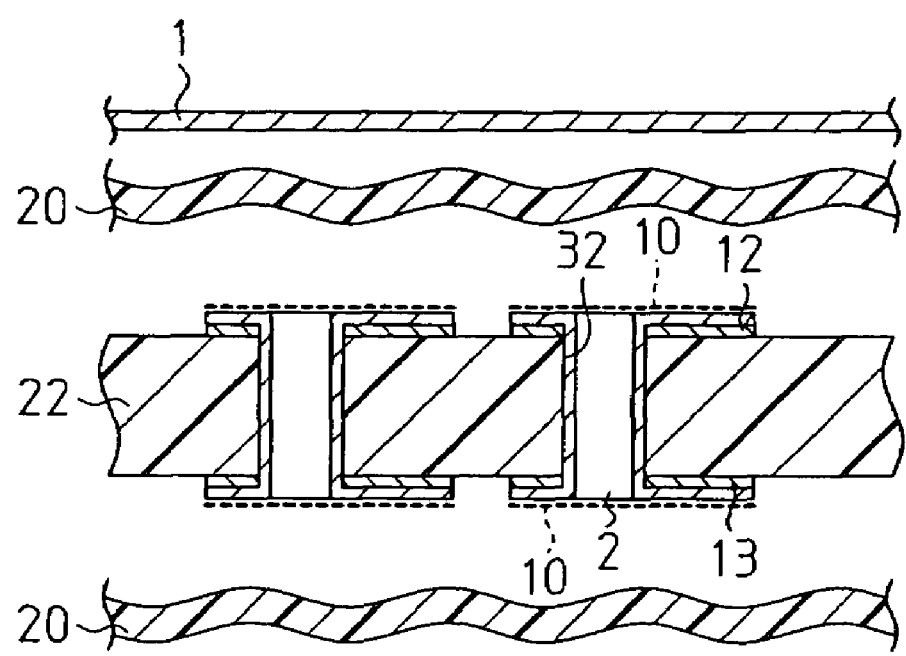
FIG. 6 is a cross-sectional view continuing from FIG. 5 showing the second insulating layer on which a prepreg and a copper foil are laminated.
Figure 7:
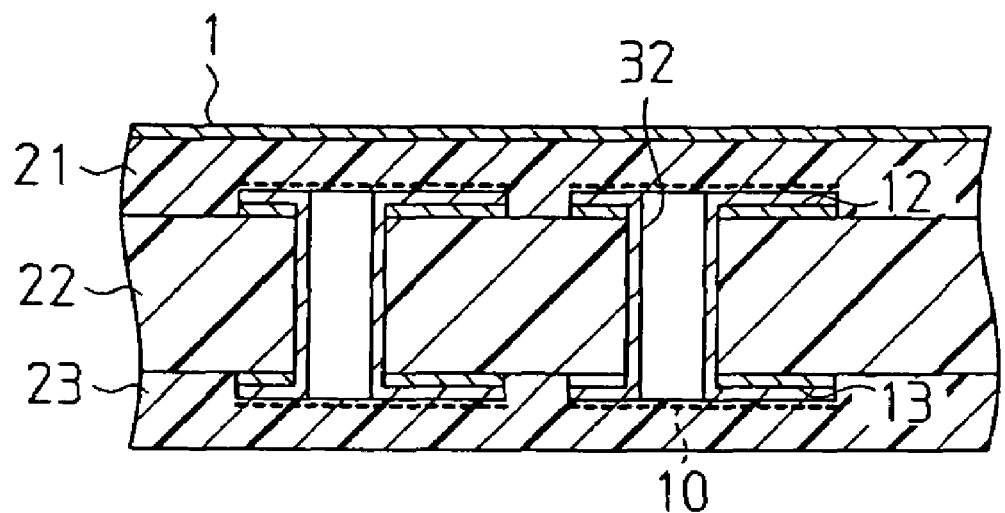
FIG. 7 is a cross-sectional view continuing from FIG. 6 showing first to third insulating layers.

Then, as shown in FIG. 6, a prepreg 20 and a copper foil 1 are laminated on the surface of the conductive layer 12, while only a prepreg 20 is laminated on the surface of the conductive layer 13, followed by hot press-bonding of the resulting laminate. Thus, as shown in FIG. 7, the second insulating layer 22 has insulating layers 21 and 23 formed on the upper side and lower side and a copper foil 1 is bonded onto the surface of the insulating layer 21. Subsequently, the copper foil 1 is etched to form a first conductive layer 11, as shown in FIG. 8.

Figure 8:
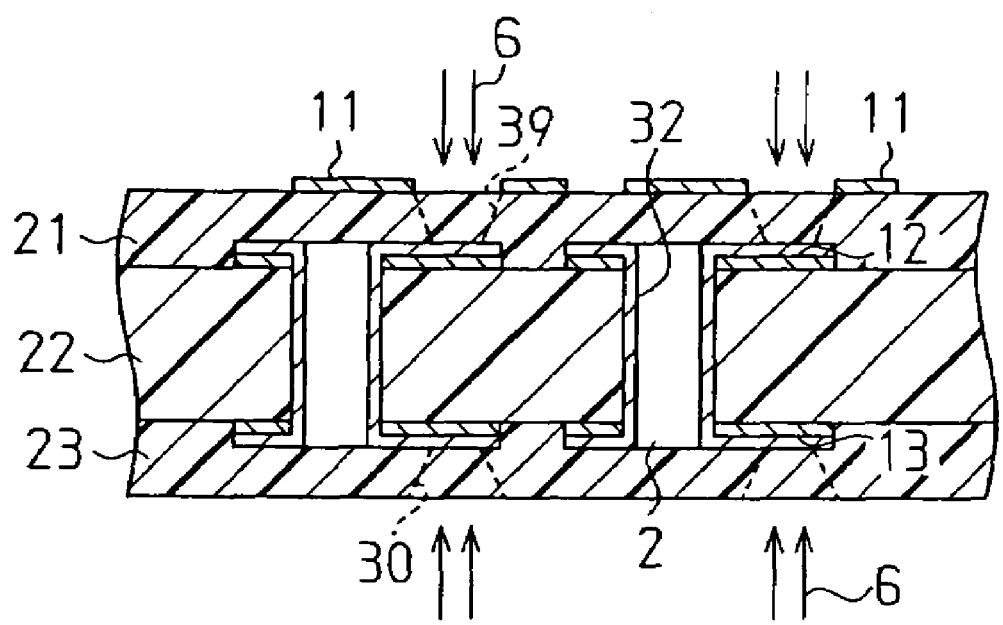
FIG. 8 is a cross-sectional view continuing from FIG. 7 showing the first to third insulating layers having a first conductive layer formed on the first insulating layer.
Figure 9:
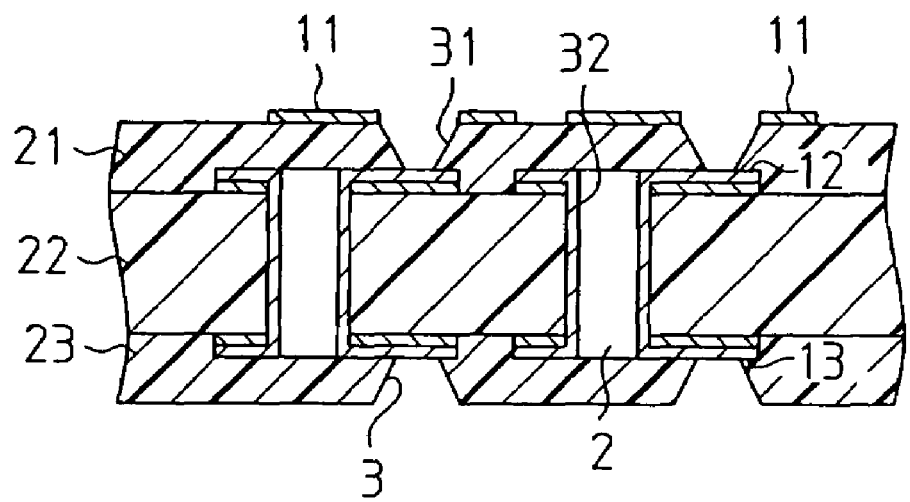
FIG. 9 is a cross-sectional view continuing from FIG. 8 showing the first to third insulating layers in which interconnecting through holes and connecting holes are formed.

As shown in FIGS. 8 and 9, a laser beam 6 is irradiated upon the insulating layer 21 at the interconnecting through hole-forming portions 39 to form interconnecting through holes 31 reaching the internal conductive layer 12. The laser beam 6 is also irradiated upon the insulating layer 23 at the bonding hole-forming portions 30 to form bonding holes 3 reaching the internal conductive layer 13.

Figure 10:
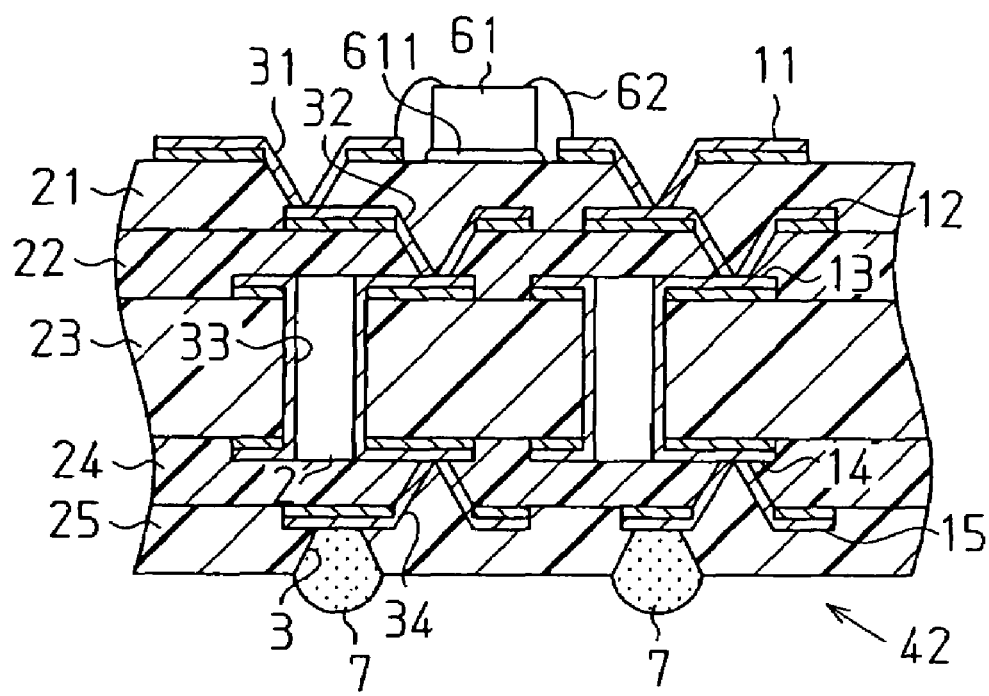
FIG. 10 is a cross-sectional view of the printed wiring board according to a second embodiment of the invention.

Subsequently, as shown in FIG. 10, chemical copper plating treatment and electric copper plating treatment are carried out to form a metal plating film 5 on the wall of each interconnecting through hole 31. A solder ball is supplied into each bonding hole 3 to form an external connecting terminal 7 connected to the conductive layer 13.

Thus, the printed wiring board 41 can be obtained.

In the above printed wiring board 41, an electronic component 61 is bonded to the surface of the first insulating layer 21 using a bonding agent 611 such as a solder. The electronic component 61 is electrically connected to the conductive layer 11 using bonding wires 62.

Further, the external connecting terminals 7 are connected to pads on the surface of a mother board 8 (FIG. 1).

Next, actions and effects of this embodiment will be described.

The printed wiring board 41 of this embodiment has three conductive layers 11 to 13 formed between three insulating layers 21 to 23, respectively, as shown in FIG. 1. The second insulating layer 22 of these three insulating layers 21 to 23 is the central insulating layer having the same number of insulating layers on the upper side and the lower side. Accordingly, as shown in FIGS. 6 and 7, no warping occurs in the printed wiring board when prepregs 20 for forming insulating layers are press-bonded.

In addition, the conductive layers 11 and 14 can be built up efficiently on the upper and lower sides of the central insulating layer 22.

Therefore, the printed wiring board 41 of this embodiment has the structure which facilitates building of the three conductive layers 11 to 13.

Furthermore, the third and last conductive layer 13 is covered with the third and outermost insulating layer 23. Accordingly, the third conductive layer 13 is embedded in the printed wiring board 41. However the external connecting terminals 7 connected to the third conductive layer 13 are exposed through the bonding holes 3 of the third and outermost insulating layer 23, so that leading of electric currents in and out of the printed wiring board 41 can be carried out through these external connecting terminals 7.

The external connecting terminals 7 are solder balls, so that they facilitate bonding with the internal conductive layer 13 and can connect the printed wiring board 41 stably to an external mother board 8.

Meanwhile, in the method of manufacturing the printed wiring board of this embodiment, a prepreg 20 and a copper foil 1 for forming the first conductive layer are laminated on the surface of the second conductive layer 12, while only a prepreg 20 is laminated onto the surface of the third conductive layer 13 with no copper foil, as shown in FIG. 6.

When the prepregs 20 and the copper foil 1 are press-bonded respectively, the first insulating layer 21 and the third insulating layer 23 can be formed simultaneously by this press-bonding treatment. Accordingly, the second insulating layer 22 already laminated into one body receives, on the upper side and lower side, thermal stress evenly from the surface prepregs 20 during the press-bonding, so that no warping occurs in the printed wiring board 41.

Further, the third and last conductive layer 13 is covered on the surface with the insulating layer 23. In this state, no electric current can be led in and out through the third conductive layer 13. However, bonding holes 3 are defined in the outermost insulating layer 24, and the external connecting terminals 7 are exposed through the bonding holes 3. Thus, electric currents can be led in and out through the third and final conductive layer 13 through these external connecting terminals 7.

Second Embodiment

The printed wiring board of the second embodiment has five conductive layers 11 to 15 which are built up as shown in FIG. 10.

The first conductive layer 11 is a component connecting layer on which an electronic component 61 is mounted and leads electric currents in and out of the component 61.

The second to fourth conductive layers 12 to 14 are electric current transmitting layers for transmitting internal electric currents of the printed wiring board 42.

The fifth conductive layer 15 is an external connecting layer for connecting external connecting terminals 7 for leading electric currents in and out of the printed wiring board 42. The surface of the fifth conductive layer 15 is covered with the fifth and outermost insulating layer 25 with the external connecting terminals 7 being exposed.

When a printed wiring board 42 of this embodiment is manufactured, conductive layers 13 and 14 and interconnecting through holes 33 are formed in the third and central insulating layer 23 in the same manner as in the first embodiment. Then, insulating layers 22 and 24 are laminated on the surfaces of the conductive layers 13 and 14, and also conductive layers 12 and 15 are formed on the insulating layers 22 and 24, respectively. Subsequently, interconnecting through holes 32 and 34 are defined in the insulating layers 22 and 24, respectively, and a metal plating film 5 is formed on the walls of these through holes 32 and 34.

Next, a first insulating layer 21 and a conductive layer 11 are formed on the surface of the conductive layer 12, followed by formation of interconnecting through holes 31, whereas a fifth insulating layer 25 is formed on the surface of the conductor layer 15, followed by formation of bonding holes 3, in the same manner as in the first embodiment.

Thus, the printed wiring board 42 having five conductive layers 11 to 15 can be obtained.

The other constitutions are the same as those in the first embodiment.

In the second embodiment, effects similar to those in the first embodiment are obtained.

Third Embodiment

The printed wiring board of the embodiment according to the second aspect of the invention will be explained referring to FIG. 11.

Figure 11:
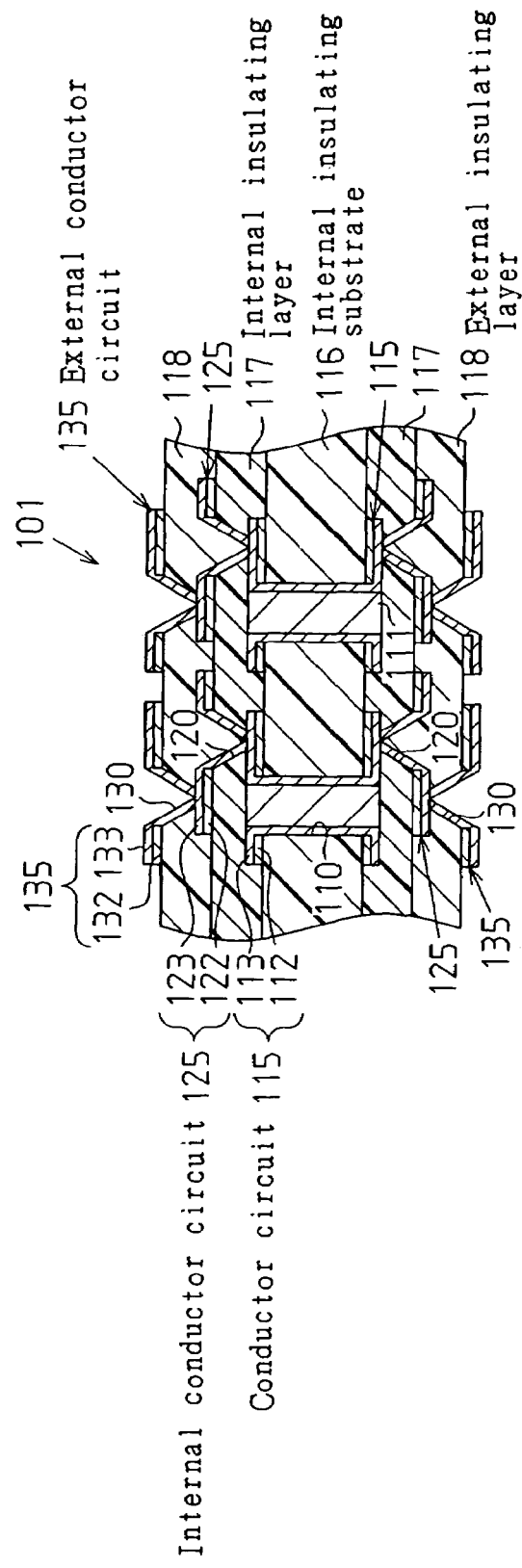
FIG. 11 is a cross-sectional explanatory drawing of the printed wiring board according to a third embodiment of the invention.

As shown in FIG. 11, the printed wiring board 101 of the third embodiment has an internal insulating substrate 116 having on each side a conductor circuit 115, an internal insulating layer 117 laminated on the surface of the internal insulating substrate 116 and an external insulating layer 118 laminated on the internal insulating layer 117. Each internal insulating layer 117 has on the surface an internal conductor circuit 125, while each external insulating layer 118 has on the surface an external conductor circuit 135.

The internal insulating layer 117 is of a glass cloth-reinforced prepreg, whereas the external insulating layer 118 is of a resin.

The internal insulating layer 117 is a prepreg prepared by impregnating a glass cloth with an epoxy resin, and the external insulating layer 118 is an epoxy resin.

Next, the printed wiring board 101 of this embodiment will be described below specifically.

The internal insulating substrate 116 in the printed wiring board 101 has conductor circuits 115 on both sides. The internal insulating substrate 116 has interconnecting through holes 110 embedded with a solder 111, and these through holes 110 secure electrical continuity between the internal conductor circuits 115.

The internal conductor circuits 115 are each composed of a copper foil pattern 112 and a plating film 113 formed on the copper foil pattern 112.

The internal insulating substrate 116 has on each side an internal insulating layer 117. The internal insulating layer 117 contains blind via holes 120 each having a plating film 123 formed on the wall.

Further, an internal conductor circuit 125 is formed on the surface of each internal insulating layer 117. The internal conductor circuit 125 is composed of a copper foil pattern 122 and a plating film 123.

The external insulating layer 118 is formed on the surface of each internal insulating layer 117. The external insulating layer 118 contains via holes 130 having plating films 133 on the walls respectively. Further, the external insulating layer 118 has on the surface an external conductor circuit 135 composed of a copper foil pattern 132 and a plating film 133.

The surface of the external insulating layer 118 is covered partly with solder resist and has lands for mounting solder balls, which are not shown.

Next, a method of manufacturing the above printed wiring board 101 will be described. According to this method, the internal insulating layers 117, external insulating layers 118, conductor circuits and interconnecting through holes are formed according to the build-up process and the additive process.

Specifically, a copper clad laminate having copper foils on the surfaces is prepared. Next, the copper foils are patterned by etching to form copper foil patterns 112, followed by formation of interconnecting through holes 110 through the resulting copper-clad laminate.

Subsequently, a plating film 113 is formed by electroless copper plating on the walls of the interconnecting through holes 110 and on the copper foil patterns 112. Thus, conductor circuits 115 connected to the interconnecting through holes can be obtained. A solder 111 is then embedded in the interconnecting through holes 110.

Next, a prepreg and a copper foil are laminated and press-bonded on each side of the internal insulating substrate 116. Thus, the copper foils can be laminated on both sides of the internal insulating substrate 116 via internal insulating layers 17 respectively.

The copper foils are then subjected to patterning to form copper foil patterns 122, followed by laser beam irradiation upon the internal insulating layers 117 to form blind via holes 120. As the laser beam, an eximer laser having a wavelength of 248 nm and an output power of 50 W is used.

The walls of the blind via holes 120 and the copper foil patterns 122 are subjected to electroless plating for forming plating films 123 on them.

Next, in the same manner as in the case where the internal insulating layers 117 and the internal conductor circuits 125 are formed, an external insulating layer 118 containing via holes 130 and an external conductor circuit 135 comprising a copper foil pattern 132 and a plating film 133 are formed on the surface of each internal insulating layer 117.

As described above, the printed wiring board 101 is obtained.

Next, actions and effects of this embodiment will be described.

In the printed wiring board 101 of this embodiment, the internal insulating layers 117 are of glass cloth-reinforced prepregs, whereas the external insulating layers 118 are of a resin. Thus, the coefficient of water absorption in the internal insulating layers 17 can be lowered.

Since the absolute amount of water contained in the internal insulating layers 117 is reduced, the amount of water vapor collecting between the layers is reduced, enhancing adhesion between the internal insulating layers 117 and the internal insulating substrate 116, and between the internal insulating layers 117 and the external insulating layers 118.

That is, the printed wiring board 101 of this embodiment has a highly reliable structure which hardly undergoes interlayer delamination.

As described above, a printed wiring board 101 which hardly undergoes interlayer delamination and can maintain high reliability even if it has a multilayer structure can be obtained according to this embodiment.

The printed wiring board 101 illustrated in this embodiment is of the structure in which internal insulating layers 117 are laminated on both sides of the internal insulating substrate 116. However, like actions and effects can be obtained even when a printed wiring board having an internal insulating layer on one side only is prepared and a glass cloth-reinforced prepreg is used as the internal insulating layer.

Like actions and effects can also be obtained for printed wiring boards having higher multilayer structures other than those having 6 layers, e.g., 8-layer substrate, 10-layer substrate.

Fourth Embodiment

The method of manufacturing the printed wiring board of the embodiment according to the third aspect of the invention will be described referring to FIGS. 12 to 24.

Figure 13:
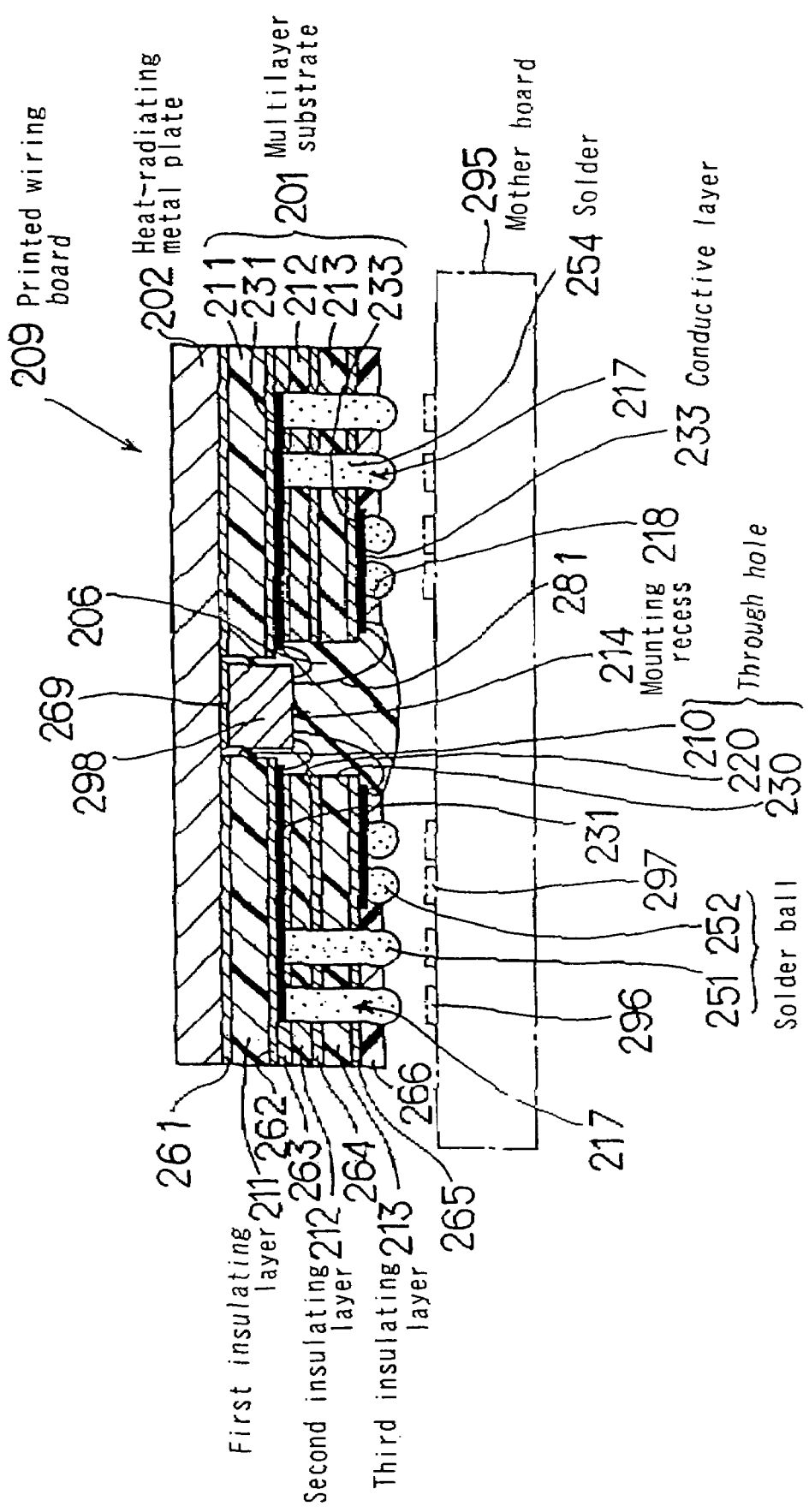
FIG. 13 is a cross-sectional view of the printed wiring board of the fourth embodiment of the invention.

The printed wiring board 209 to be manufactured according to this embodiment has, as shown in FIG. 13, a multi-layer substrate 201 containing first to third insulating layers 211 to 213 and two conductive layers 231 and 233 formed thicknesswise with respect to the insulating layers; through holes 210, 220 and 230 formed to penetrate all of the first to third insulating layers 211 to 213; and a heat-radiating metal plate 202 provided on the upper side of the multilayer substrate 201 so as to cover the through holes 210, 220, 230.

The through holes 210, 220 and 230 and the heat-radiating metal plate 202 define a mounting recess 214 for mounting an electronic component 298. The multilayer substrate 201 is provided with interconnecting through holes 217 and 218 communicating with the conductive layers 231 and 233, respectively.

Solder balls 251 and 252 are located on the multilayer substrate 201 on the side on which the mounting recess 214 opens. One solder ball 251 is connected to the lower opening of the interconnecting through hole 217. The solder ball 251 connects, via the interconnecting through hole 217, the conductive layer 231 provided in the multilayer substrate 201 with a mother board 295. The other solder ball 252 is connected to the conductive layer 233 provided on the lower side of the multilayer substrate 210 to connect the conductive layer 233 to the mother board 295.

The solder balls 251 and 252 are fused to the terminals 296 and 297 provided on the surface of the mother board 295.

Figure 12:
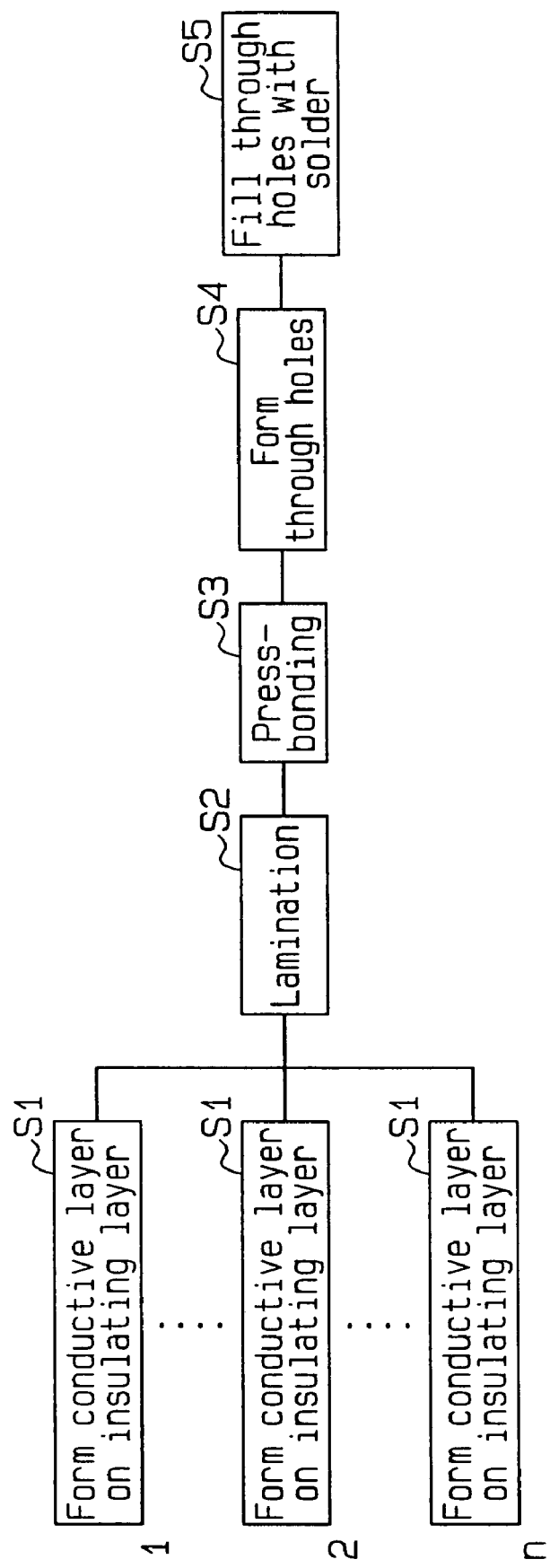
FIG. 12 is an explanatory drawing showing the process of manufacturing the printed wiring board according to a fourth embodiment of the invention.
Figure 16:
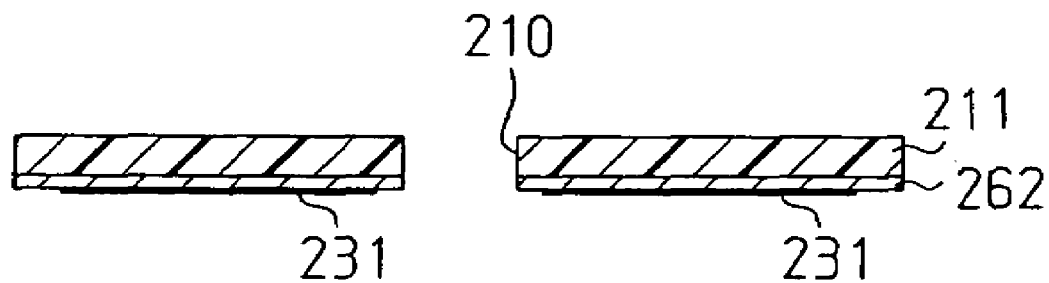
FIG. 16 is a cross-sectional view continuing from FIG. 15 showing the insulating layer on which a conductive layer is formed.
Figure 18:
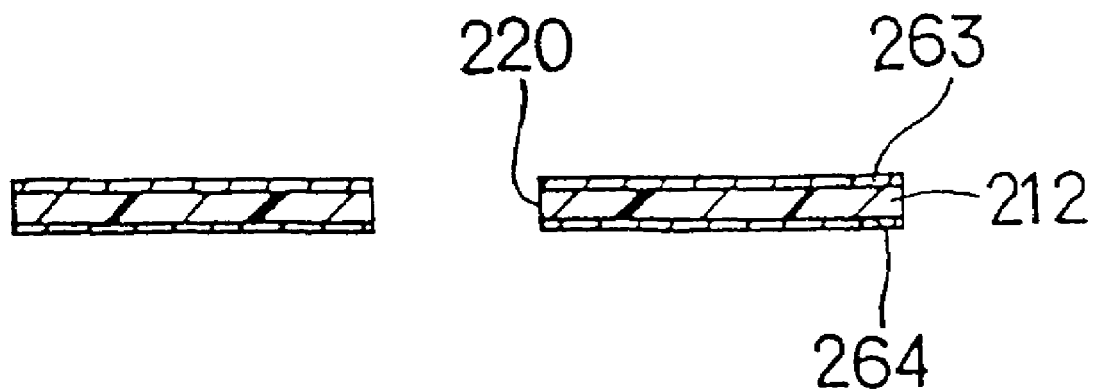
FIG. 18 is a cross-sectional view continuing from FIG. 17 showing the insulating layer in which a through hole for defining a mounting recess is formed.
Figure 21:
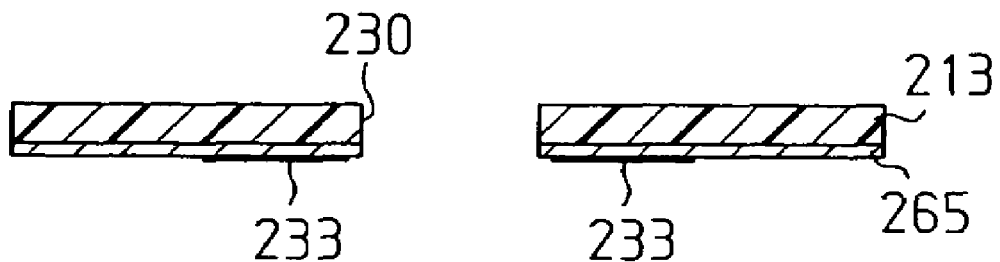
FIG. 21 is a cross-sectional view continuing from FIG. 20 showing the insulating layer on which a conductive layer is formed.
Figure 23:
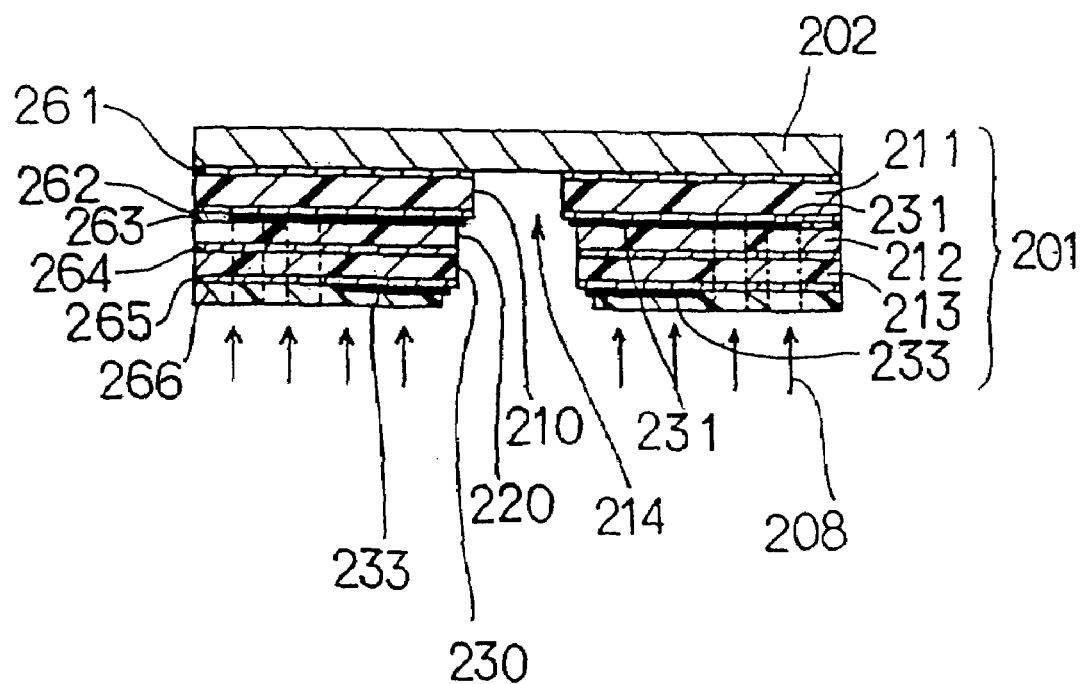
FIG. 23 is a cross-sectional view of a multilayer substrate formed by laminating and press-bonding the first insulating layer, the second insulating layer, the third insulating layer and a heat-radiating metal plate.
Figure 24:
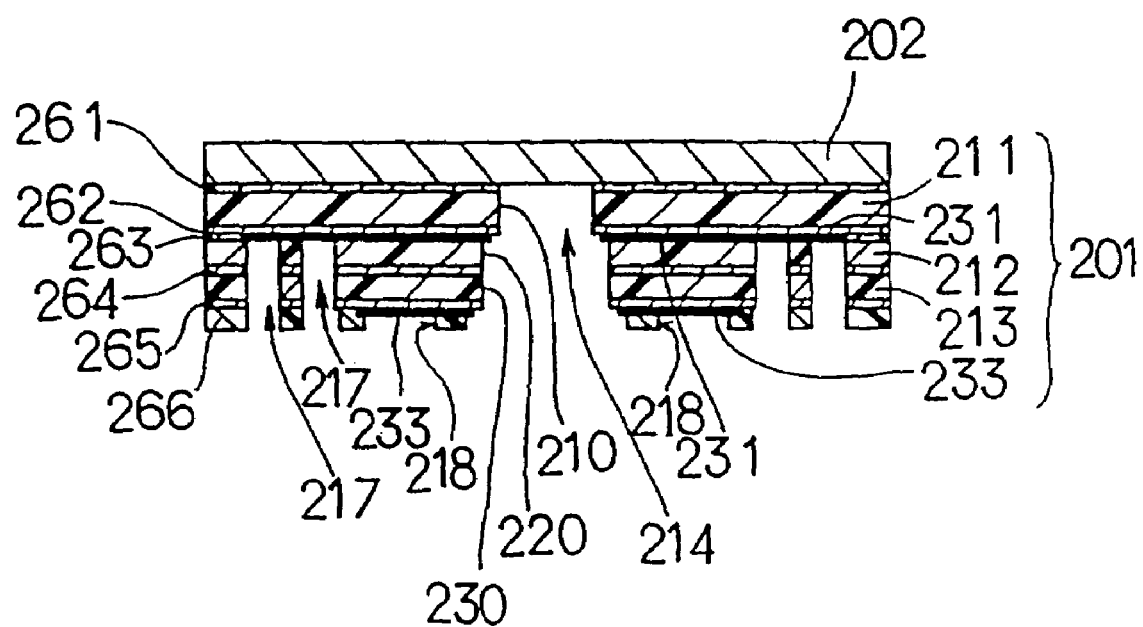
FIG. 24 is a cross-sectional view continuing from FIG. 23 showing the multilayer substrate containing interconnecting through holes.

Next, the outline of the method of manufacturing the printed wiring board 209 of this embodiment will be described referring to FIG. 12. First, in step S1, conductive layers 231 and 233 are formed on a number n of insulating layers 211 to 213 (FIGS. 16, 18 and 21). Subsequently, in steps S2 and S3, the insulating layers 211 to 213 are laminated and press-bonded to form a multilayer substrate 201 (FIG. 23). Subsequently, in step S4, laser beam 208 is irradiated upon the multilayer substrate 201 at interconnecting through hole-forming portions to define interconnecting through holes 217 and 218 such that the bottoms of these through holes reach the conductive layers 231 and 233, respectively (FIG. 24). In step S5, solders 251 and 252 are packed into the interconnecting through holes 217 (FIG. 12).

Next, the method of manufacturing the above printed wiring board 209 will be described in detail referring to FIGS. 14 to 24.

First, a flexible film made of a glass-fiber reinforced epoxy material is prepared as an insulating layer. The flexible film is a flexible belt-like film having a thickness of 0.05 mm and a width of 2.5 to 15 cm. This flexible film is preliminary rolled into a plurality of web rolls.

Figure 14:
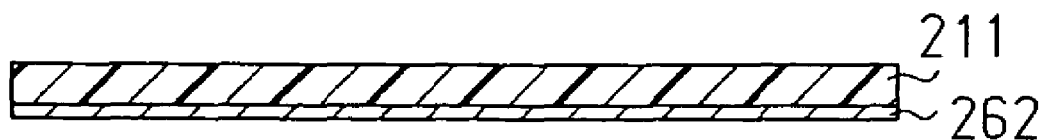
FIG. 14 is a cross-sectional view of an insulating layer for illustrating the method of forming the first insulating layer of the fourth embodiment.
Figure 15:
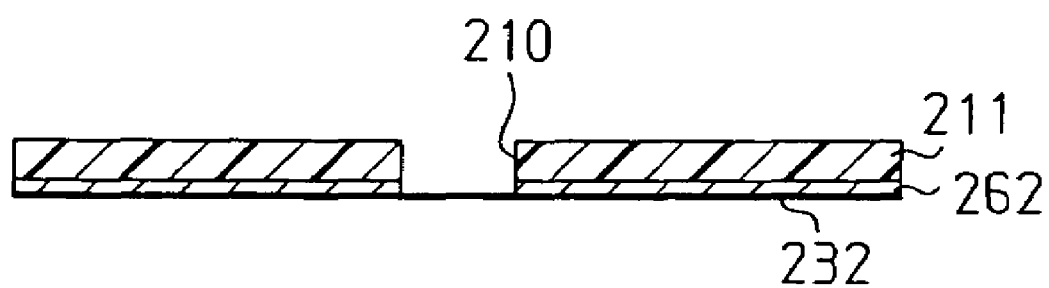
FIG. 15 is a cross-sectional view continuing from FIG. 14 showing the insulating layer on which a copper foil is bonded.

Next, the flexible film is delivered as the insulating layer from one of the rolls. Then, as shown in FIG. 14, an insulating adhesive 262 which is of a thermoplastic glass fiber-reinforced epoxy material is bonded to the lower side of the delivered insulating layer 211, and a through hole 210 is then formed by punching substantially at the center of the resulting insulating layer 211, as shown in FIG. 15. Subsequently, a copper foil 232 having a thickness of 35 μm is bonded to the lower side of the insulating layer 211 via the insulating adhesive 262, as shown in FIG. 15.

Then, as shown in FIG. 16, a conductive layer 231 is formed from the copper foil by means of irradiation and etching, and an Ni/Au plating film is formed to cover the surface of the conductive layer 231. Thus, a first insulating layer 211 serving as an upper layer of the multilayer substrate 201 is obtained.

Figure 17:
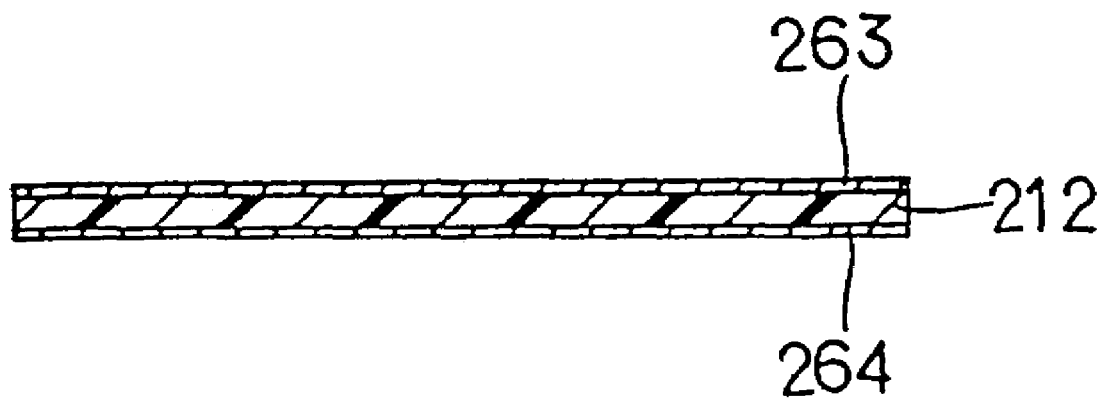
FIG. 17 is a cross-sectional view of the insulating layer for illustrating the method of forming the second insulating layer of the fourth embodiment.

As shown in FIG. 17, insulating adhesives 263 and 264 which are of the same material as that of the insulating adhesive 262 is adhered to the upper and lower sides of the flexible film serving as the insulating layer 212 delivered from another roll. Subsequently, as shown in FIG. 18, a through hole 220 is formed by punching processing substantially at the center of the insulating layer 212. Thus, a second insulating layer 212 serving as an intermediate layer of the multilayer substrate is obtained.

Figure 19:
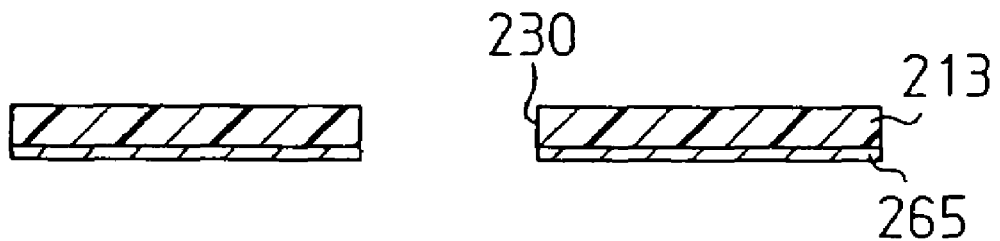
FIG. 19 is a cross-sectional view of the insulating layer for illustrating the method of forming the third insulating layer of the fourth embodiment.

As shown in FIG. 19, an insulating adhesive 265 which is of the same material as that of the insulating adhesive 262 is adhered to the lower side of the flexible film serving as the insulating layer 213 delivered from another roll.

Figure 20:
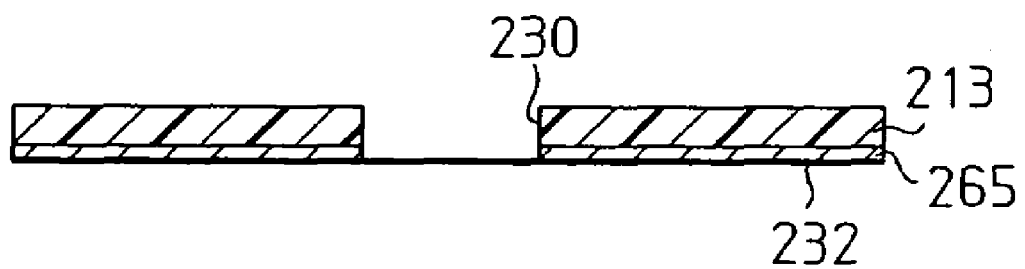
FIG. 20 is a cross-sectional view continuing from FIG. 19 showing the insulating layer on which a copper foil is bonded.

Subsequently, as shown in FIG. 20, the lower side of the insulating layer 213 is covered with a copper foil 232.

Next, as shown in FIG. 21, the copper foil 230 is subjected to patterning by means of irradiation and etching to form a conductive layer 233, and then an Ni/Au plating film is formed on the surface of the conductive layer 233.

Figure 22:
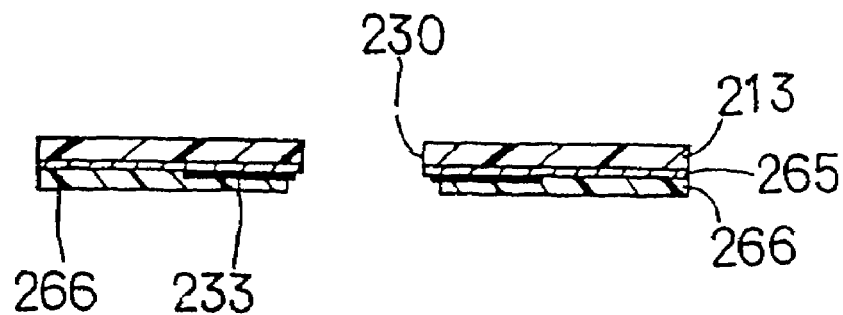
FIG. 22 is a cross-sectional view continuing from FIG. 21 showing the insulating layer covered with a solder resist.

As shown in FIG. 22, the lower side of the insulating layer 213 is covered with a solder resist 266. Thus, a third insulating layer 213 serving as a lower layer of the multilayer substrate 201 is obtained.

Subsequently, as shown in FIG. 23, the first insulating layer 211, the second insulating layer 212 and the third insulating layer 213 are laminated and press-bonded with heating by the insulating adhesives 262 to 264. Thus, a multilayer substrate 201 having three layers is obtained.

A copper heat-radiating metal plate 202 having a thickness of 1.0 mm is press-bonded to the upper side of the multilayer substrate 201 via an insulating adhesive 261, and thus a mounting recess 214 is defined by the through holes 210, 220 and 230 and the heat-radiating metal plate 202 covering the upper side of the through holes.

Next, a laser beam 208 is irradiated upon the multilayer substrate 201 at interconnecting through hole-forming portions. As the laser beam, a $CO_2$ laser is employed. Thus, interconnecting through holes 217 and 218 are formed in the multilayer substrate 201 so that the bottoms of the through holes 217 and 218 reach the conductive layers 231 and 233, respectively.

Subsequently, as shown in FIG. 13, a solder 254 is packed into the deep interconnecting through holes 217, and then solder balls 251 and 252 are fuse-bonded to the lower openings of the interconnecting through holes 217 and the lower openings of the shallow interconnecting through holes 218.

Thus, a printed wiring board 209 is obtained.

Then, as shown in FIG. 13, an electronic component 298 is mounted in the mounting recess 214 using a die-bonding material 269 such as a silver paste and a solder. Next, the electronic component 298 and the tips of the conductive layers 231 and 233 are bonded using wires 281, and then the space in the mounting recess 214 is filled with a sealing resin 206.

Next, actions and effects of this embodiment will be described.

In this embodiment, as shown in FIGS. 23 and 24, interconnecting through holes 217 and 218 are formed by irradiating the laser beam 208 after lamination of the first to third insulating layers 211 to 213. Accordingly, the interconnecting through holes 217 and 218 penetrating through the insulating layers 212 and 213 can be formed by a single hole-defining procedure. Further, there is no need of forming through holes for forming the interconnecting through holes for the respective insulating layers.

Further, interconnecting through holes 217 and 218 having different depths can be formed by a single hole-defining procedure.

There is no need of positioning the insulating layers for securing continuity of the through holes as required in the prior art. Further, even small interconnecting through holes can be formed accurately.

Since the thickness of the conductive layers 231 and 233 are 35 μm, interconnecting through holes 217 and 218 can be formed without forming holes in the conductive layers 231 and 233.

Fifth Embodiment

The printed wiring board of the embodiment according to the fourth aspect of the invention will be described referring to FIGS. 25 to 32.

The printed wiring board 305 of the fifth embodiment has an interconnecting through hole 302 penetrating an insulating substrate 307. One opening of the interconnecting through hole 302 is covered by a covering pad 311, while the other opening remains open and has a conductor circuit 316 along the opening edge.

The covering pad 311 and the conductor circuit 316 are electrically connected via a metal plating film 323 covering the wall of the interconnecting through hole 302.

A solder ball 303 for external connection is bonded onto the surface of the covering pad 311. The solder ball 303 is aligned with the central axis A of the interconnecting through hole 302. The surface of the insulating substrate 307 is covered with a solder resist 306, and the interconnecting through hole 302 is packed with the solder resist 306.

Figure 26:
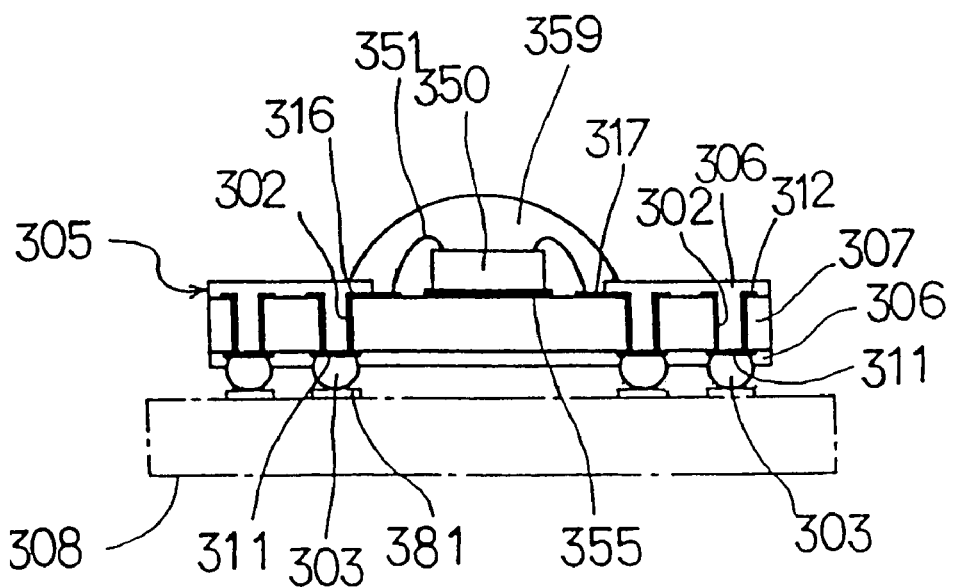
FIG. 26 is a cross-sectional view of the printed wiring board of the fifth embodiment.
Figure 27:
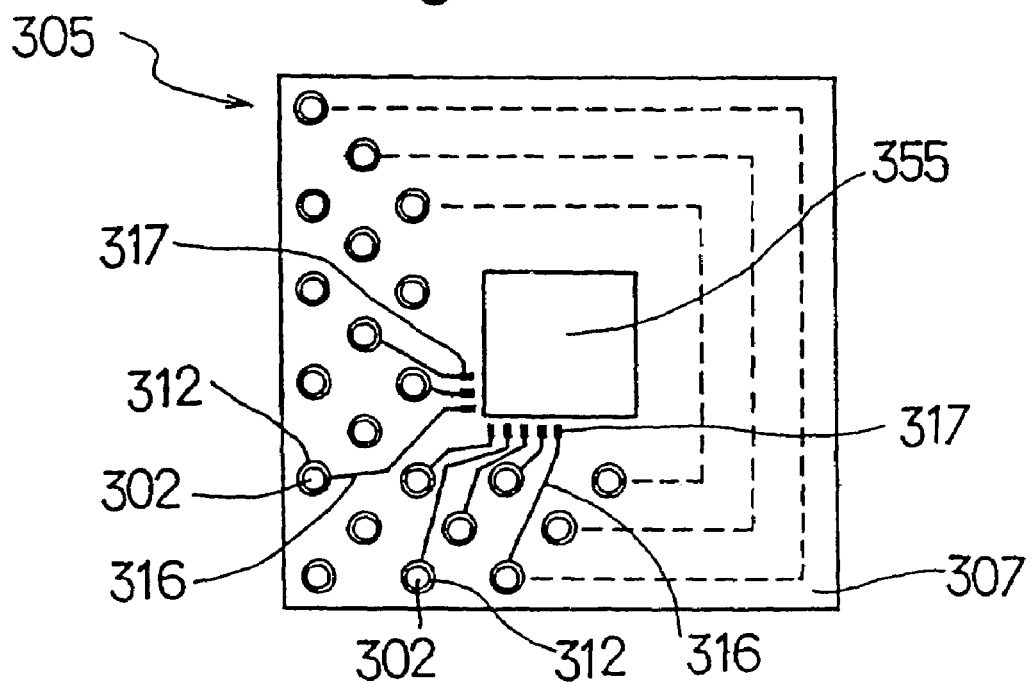
FIG. 27 is a plan view of the printed wiring board of the fifth embodiment.

Further, as shown in FIGS. 26 and 27, the upper side of the insulating substrate 307 is provided with an annular land 312 formed along the opening edge of the interconnecting through hole 302 and a mounting pad 355 for mounting an electronic component 350. A bonding pad 317 for bonding wires 351 to be connected to the electronic component 350 are provided around the mounting pad 355. The electronic component 350 and the bonding wires 351 are protected by a sealing resin 359.

Figure 28:
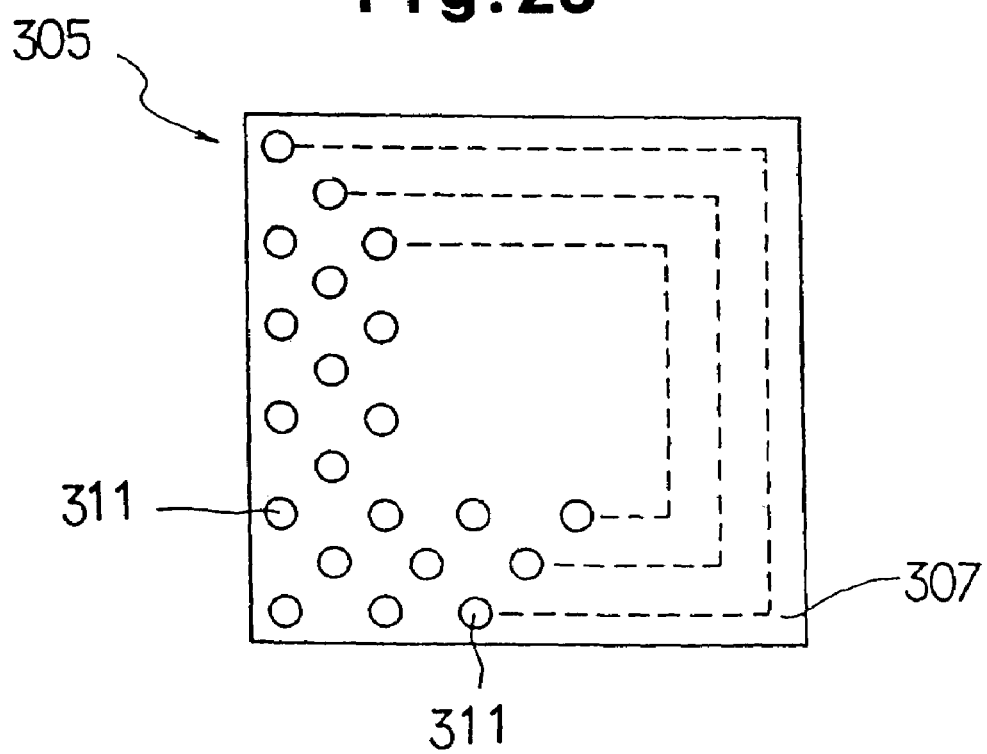
FIG. 28 is a bottom view of the printed wiring board of the fifth embodiment.

Meanwhile, as shown in FIGS. 26 and 28, a multiplicity of covering pads 311 for bonding solder balls 303 are provided on the lower side of the insulating substrate 307 in alignment with the interconnecting through holes 302 respectively. The solder balls 303 are fused to pads 381 of a mother board 308 or the like.

Next, the method of manufacturing the above printed wiring board 305 will be described.

First, an insulating substrate 307 composed of an epoxy, polyimide or bismaleimidotriazine resin and a glass fiber or glass cloth reinforcing material is prepared. A copper foil is bonded onto the surface of the insulating substrate 307.

Figure 29:
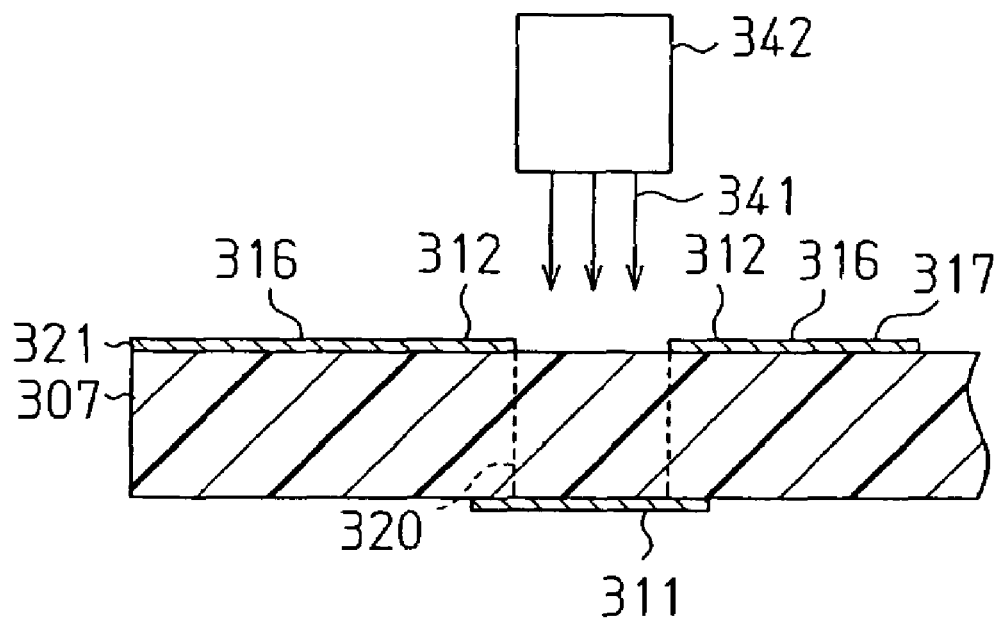
FIG. 29 is an explanatory drawing showing a method of forming interconnecting through holes in an insulating substrate in the fifth embodiment.

The insulating substrate 307 is then subjected to treatments such as light exposure and etching to effect patterning of the copper foil 321, as shown in FIGS. 29 and 26, and form a conductor circuit 316, a bonding pad 317 and a mounting pad 355. Simultaneously, covering pads 311 for covering interconnecting through hole-forming portions 320 and annular lands 312 surrounding the peripheral edges of the interconnecting through hole-forming portions 320 are formed on one side and on the other side of the insulating substrate 307, respectively.

Next, as shown in FIG. 29, laser beam 341 is irradiated upon the insulating substrate 307 at the interconnecting through hole-forming portions 320. A laser irradiator 342 is moved horizontally along the plane of the insulating substrate 307 to emit the laser beam 341 at the spots corresponding to the interconnecting through hole-forming portions 320. As the laser beam 341, it is preferred to use a $CO_2$ laser having great output power energy, an eximer laser which gives less thermal influence or the like.

Formation of the interconnecting through holes 302 by irradiation of the laser beam 341 is carried out by vaporizing and removing the insulating substrate 307 at the corresponding portion with the high energy of the laser beam 341 to bore gradually into the insulating substrate 307. Upon the reaching of the tip of the laser beam 341 to each covering pad 311 covering the bottom, the laser beam 341 is reflected by the copper foil serving as the covering pad 311, and irradiation of the laser beam 341 is then terminated. The interconnecting through holes 302 have a diameter of, for example, 0.1 mm.

Figure 30:
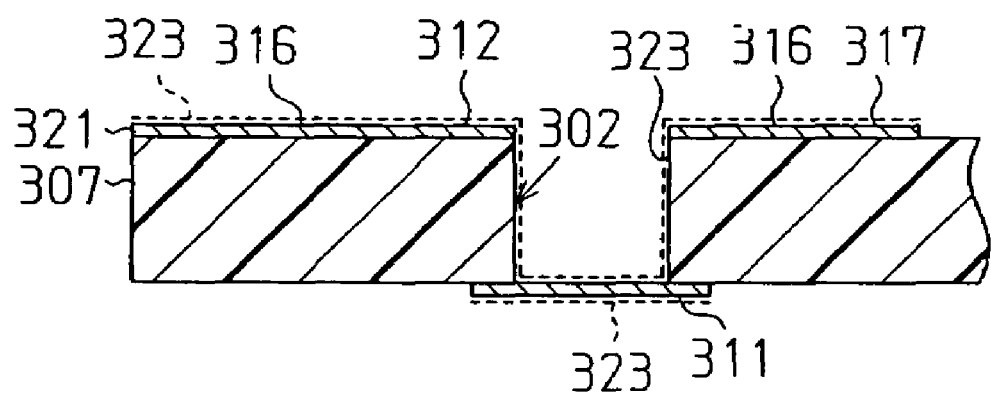
FIG. 30 is an explanatory drawing showing a method of applying chemical copper plating treatment to the insulating substrate in the fifth embodiment.

Then, as shown in FIG. 30, a thin chemical copper plating film 321 having a thickness of about 1 µm is formed on portions where metal plating films are to be formed, i.e., on the patterned copper foil 321 and the walls of the interconnecting through holes 302, followed by cleaning of the thus treated insulating substrate 307.

Figure 31:
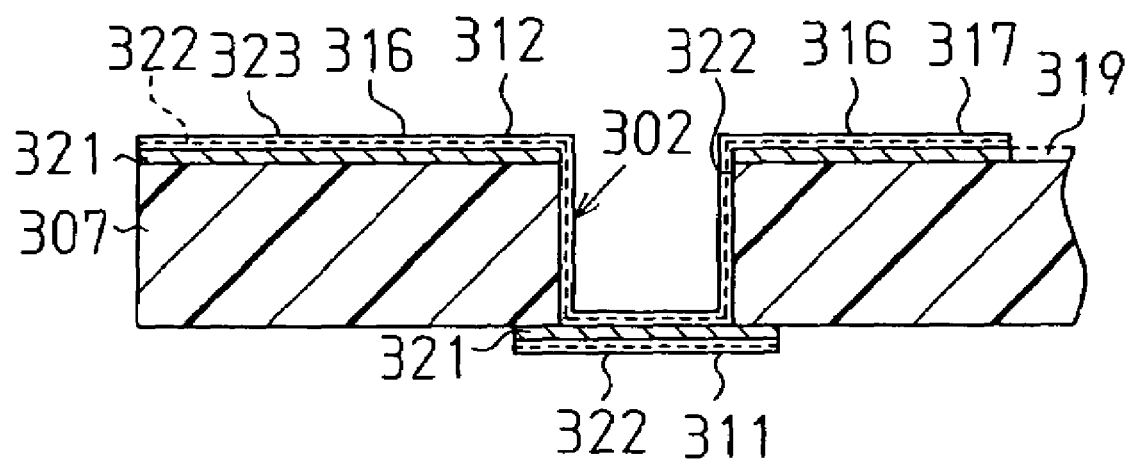
FIG. 31 is an explanatory drawing showing a method of applying electrical copper plating treatment to the insulating substrate in the fifth embodiment.

Next, as shown in FIG. 31, the surface of the insulating substrate 307 including the walls of the interconnecting through holes 302 is subjected to electrical copper plating treatment. The electrical copper plating treatment is carried out by immersing the insulating substrate 307 together with an anode into an electrical plating bath with the chemical copper plating film being connected to the cathode via an electric lead 319. The electrical plating bath contains copper sulfate and has a bath temperature of 60° C. In this state, an electric current having a density of 0.8 to 1.4 $A/dm^2$ is applied across the chemical plating film 323 for 20 minutes.

Thus, the copper melts out of the cathode surface to deposit on the surface of the chemical plating film serving as the anode, forming a copper metal plating film 322 on the walls of the interconnecting through holes 302 and also covering the surfaces of the covering pads 311, conductor circuits 316, lands 312, bonding pads 317 and mounting pad 355 (see FIG. 27). Incidentally, the electric lead 319 is removed by means of etching, laser irradiation or the like, after the plating treatment.

Figure 32:
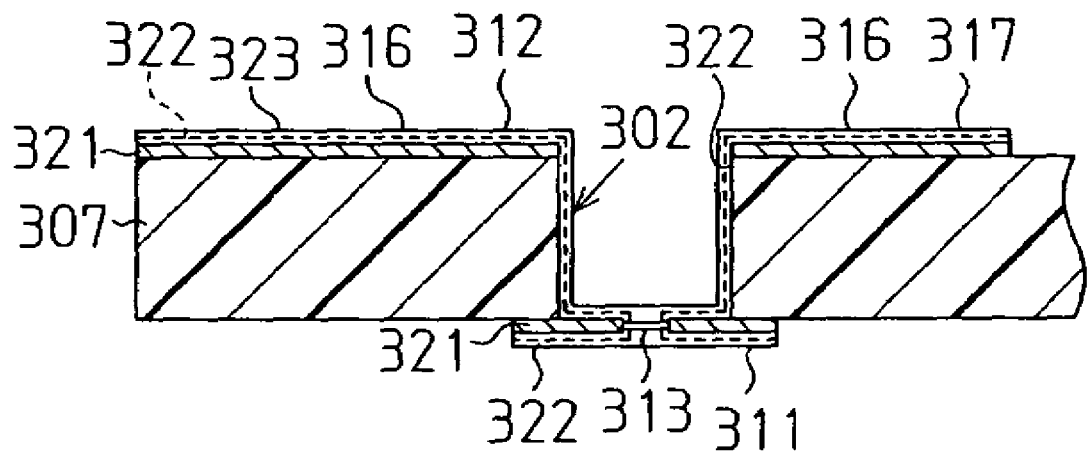
FIG. 32 is an explanatory drawing showing the state of the plating layer formed when a plating solution distributing pinhole is formed in the covering pad.

Pinholes 313 can be formed at the centers of the covering pads 311, as shown in FIG. 32, since the laser beam energy is high at the center and low around the peripheral portion. These pinholes 313 serve as distribution channels of the plating solution, as will be described later, to allow sufficient distribution of the plating solution in and out of the interconnecting through holes, enabling formation of the metal plating film 322 uniformly on the wall of each interconnecting through hole 302.

Next, as shown in FIG. 26, the surface of the insulating substrate 307 is covered with a solder resist 306. By this treatment, the interconnecting through holes 302 are packed with the solder resist 306. Meanwhile, the surfaces of the solder ball bonding portions of the covering pads 311, bonding pads 317 and mounting pad 355 are exposed without being covered with the resist 306.

Then, solder balls 303 are supplied to the surfaces of the covering pads 311 with the side of the insulating substrate 307 on which the covering pads 311 are formed facing upward, followed by fusing of the solder balls 303 with heating to bond the solder balls 303 with the covering pads 311, respectively.

Subsequently, an electronic component 350 is mounted on the surface of the mounting pad 355 using a bonding agent such as a silver paste and is connected to the bonding pads 317 with bonding wires 351. The electronic component 350 and the bonding wires 351 are then sealed with a sealing resin 359.

As described above, the printed wiring board 305 shown in FIGS. 25 to 28 can be obtained.

Now, actions and effects of this embodiment will be described.

In the printed wiring board 305 of this embodiment, one opening of each interconnecting through hole 302 is covered with a covering pad 311 on which a solder ball 303 is bonded. Accordingly, the covering pad 311 for bonding the solder ball 303 can be substantially aligned with the interconnecting through hole 302.

Therefore, the area to be occupied by the interconnecting through hole coincides with the area to be occupied for bonding the solder ball, so that high-density packaging of the interconnecting through holes 302 and the solder balls 303 is achieved.

Further, the areas to be occupied by the interconnecting through holes 302 and solder balls 303 can be narrowed to afford extra spaces on the surface of the insulating substrate 307. Accordingly, conductor circuits and the like can be formed on such extra spaces, enabling high densification of surface packaging on the insulating substrate.

Meanwhile, as shown in FIG. 29, since the interconnecting through holes 302 are formed by irradiation of the laser beam 341, fine interconnecting through holes 302 can be formed easily and accurately, realizing much higher density packaging.

Sixth Embodiment

The sixth embodiment is an embodiment of the fourth aspect of the invention.

Figure 33:
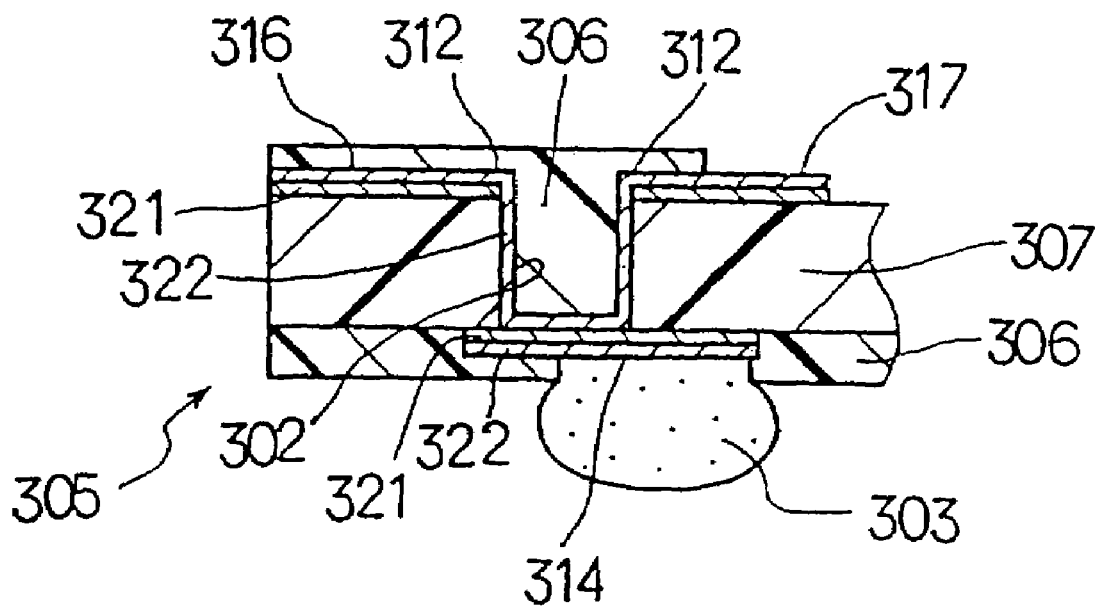
FIG. 33 is a cross-sectional view showing the pertinent portion of the printed wiring board according to a sixth embodiment of the invention.

In the printed wiring board 305 of this embodiment, the solder balls 303 are offset from the respective interconnecting through holes 302, as shown in FIG. 33.

Figure 34:
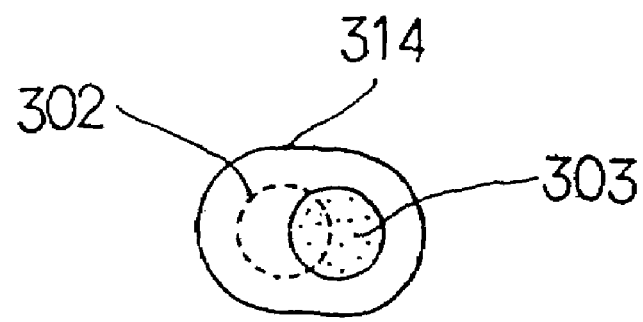
FIG. 34 is an explanatory drawing of the covering pad in the sixth embodiment.

As shown in FIG. 34, one opening of each interconnecting through hole 302 is covered with an ellipsoidal covering pad 314. On the surface of this covering pad 314 is bonded a solder ball 303 at a position offset from the central axis of the interconnecting through hole 302. The solder ball 303 is located to overlap with at least a portion of the opening of the interconnecting through hole 302.

The other constitutions are the same as those in the fifth embodiment.

In this embodiment, since the solder balls 303 are located at positions offset from the central axis of the interconnecting through holes 302 respectively, a larger area is required for bonding solder balls and for forming the interconnecting through holes compared with the fifth embodiment. However, since each solder ball 303 is bonded to a part of the covering pad 314 covering the opening of each interconnecting through hole 302 in this embodiment, the solder ball bonding area and the interconnecting through hole-forming area need not be formed completely separately unlike in the prior art. Therefore, according to the present invention, not only high-density packaging of interconnecting through holes and solder balls but also high-density wiring on the surface of the insulating substrate can be realized.

Seventh Embodiment

The seventh embodiment is an embodiment of the fourth aspect of the invention.

Figure 35:
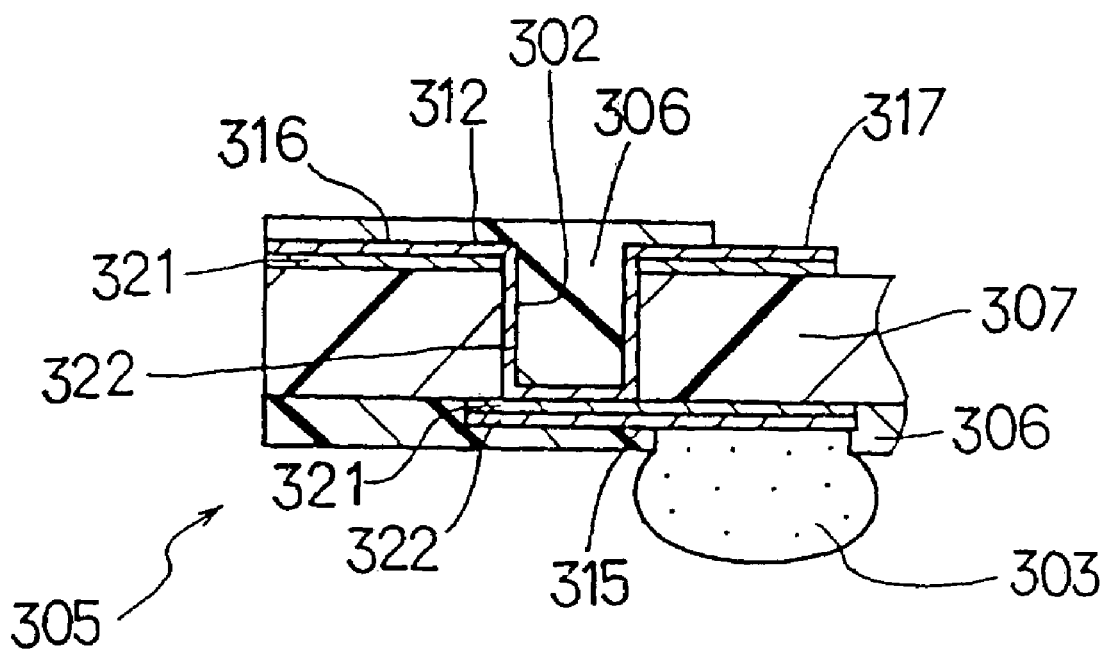
FIG. 35 is a cross-sectional view showing the pertinent portion of the printed wiring board according to a seventh embodiment of the invention.

In the printed wiring board 305 of the seventh embodiment, each solder ball 303 is bonded at a position spaced slightly away from the interconnecting through hole 303, as shown in FIG. 35.

Figure 36:
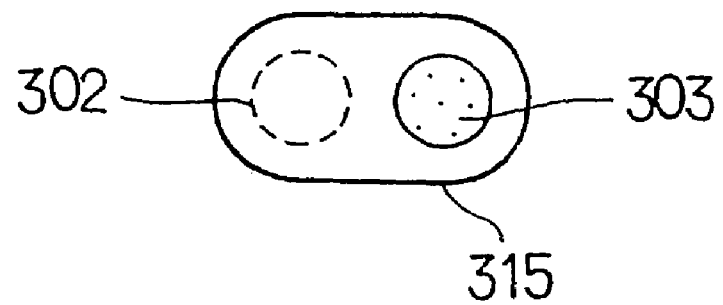
FIG. 36 is an explanatory drawing of the covering pad in the seventh embodiment.

As shown in FIG. 36, the solder ball 303 is bonded on the surface of an ellipsoidal covering pad 315 at a position adjacent to the interconnecting through hole 302.

The other constitutions are the same as those in the sixth embodiment.

In this embodiment, since each solder ball 303 is bonded at a position adjacent to the interconnecting through hole 302, a large area is required for bonding solder balls and for forming the interconnecting through holes compared with the prior art. However, since each solder ball 303 is bonded to a part of the covering pad 315 covering the opening of the interconnecting through hole 302 in this embodiment, not only high-density packaging but also high-density wiring on the surface of the insulating substrate can be realized like in the sixth embodiment.

Eighth Embodiment

The eighth embodiment is an embodiment of the fourth aspect of the invention.

Figure 37:
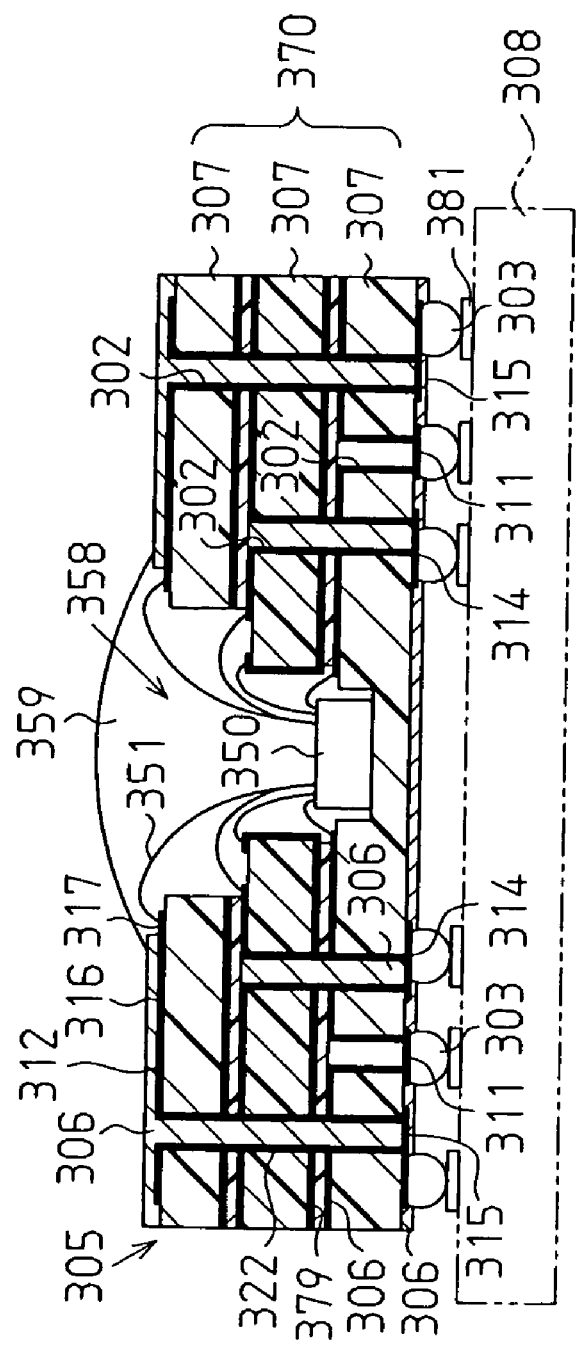
FIG. 37 is a cross-sectional view of the multilayer printed wiring board according to an eighth embodiment of the invention.

The printed wiring board 305 of this embodiment is a multilayer substrate 370 formed by laminating a plurality of insulating substrates 307, as shown in FIG. 37.

The printed wiring board 305 has interconnecting through holes 302 for electrically connecting the layers of the multilayer substrate 370. The openings of the interconnecting through holes 302 on the lower side of the substrate 370 are covered with covering pads 311, 314 and 315 located at different positions with respect to the through holes 302 respectively. The openings of the interconnecting through holes 302 on the upper side remain open, and a conductor circuit 316 is formed along the opening edge of each through hole 302. Incidentally, some of the interconnecting through holes 302 penetrate the multilayer substrate 370, and some do not.

The covering pads 311, 314 and 315 are electrically connected to the conductor circuits 316 by the metal plating films 322 covering the walls of the interconnecting through holes 302. A solder ball 303 to be connected to a pad 381 of a mother board 308 and or like is bonded to the surface of each covering pad 311.

Figure 25:
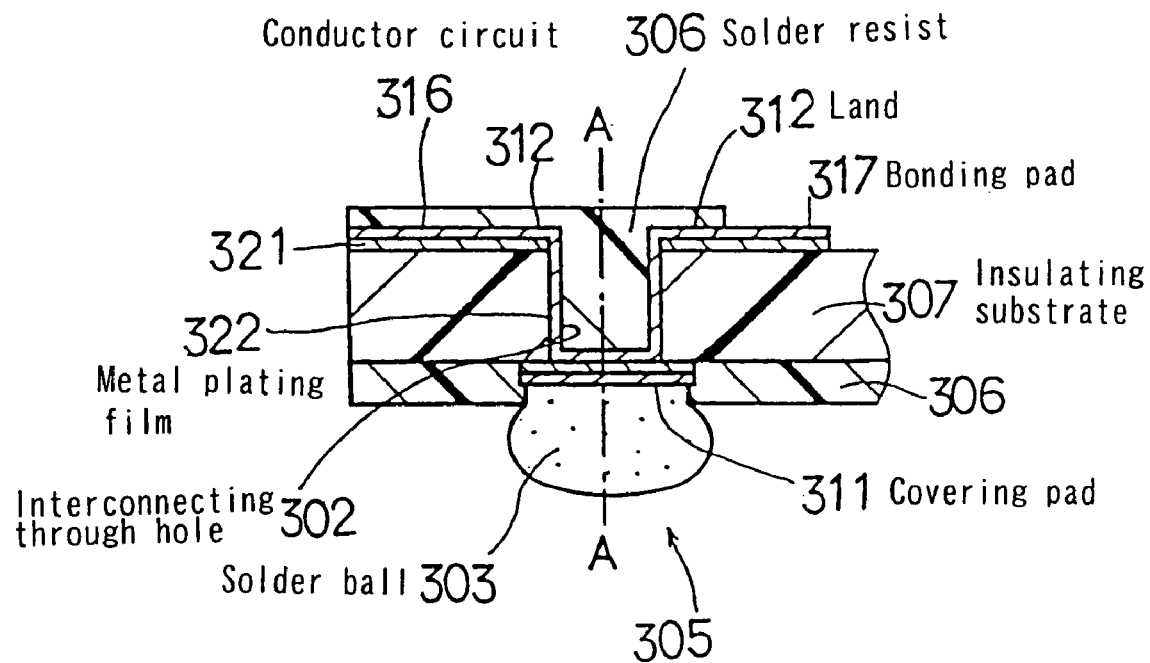
FIG. 25 is a cross-sectional view showing the pertinent portion of the printed wiring board according to a fifth embodiment of the invention.

A solder ball 303 is bonded onto the surface of each covering pad 311 to be aligned with the central axis A of the interconnecting through hole 302 (see FIG. 25). A solder ball 303 is bonded to the surface of another covering pad 314 at a position offset from the central axis of the interconnecting through hole 302 and overlapping with the interconnecting through hole 302 (see FIG. 34). A solder ball 303 is bonded onto the surface of another covering pad 315 at a position offset from the central axis of the interconnecting through hole 302 and not overlapping with the interconnecting through hole 302, i.e. at a position adjacent to the interconnecting through hole (see FIG. 36).

The printed wiring board 305 is provided with a mounting recess 358 opening stepwise substantially at the center. An electronic component 350 is mounted at the bottom of the mounting recess 358. The electronic component 350 is electrically connected to bonding pads 317 exposed to the step-like mounting recess 358 by bonding wires 351. The inner space of the mounting recess 358 is sealed by a sealing resin 359.

A conductor circuit 316 is formed on the surface of each insulating substrate 307. Each insulating substrate 307 is covered on the surface with a solder resist 306. The interconnecting through holes 324 and 325 are packed with the solder resist 306. The insulating substrates 307 are bonded to one another with bonding materials 379 such as prepregs.

The other constitutions are the same as those in the fifth embodiment.

In this embodiment, the multilayer substrate 370 formed by laminating a plurality of insulating substrates 307 contains interconnecting through holes 302, some of which penetrate all of the insulating substrates 307 and some of which do not, for electrically connecting the layers, thus enabling formation of conductor circuits 316 with high density in the form of multilayer. Further, it is possible to form lager numbers of interconnecting through holes and covering pads and to bond a larger number of solder balls 303.

Ninth Embodiment

The ninth embodiment is an embodiment of the fifth aspect of the invention.

Figure 38:
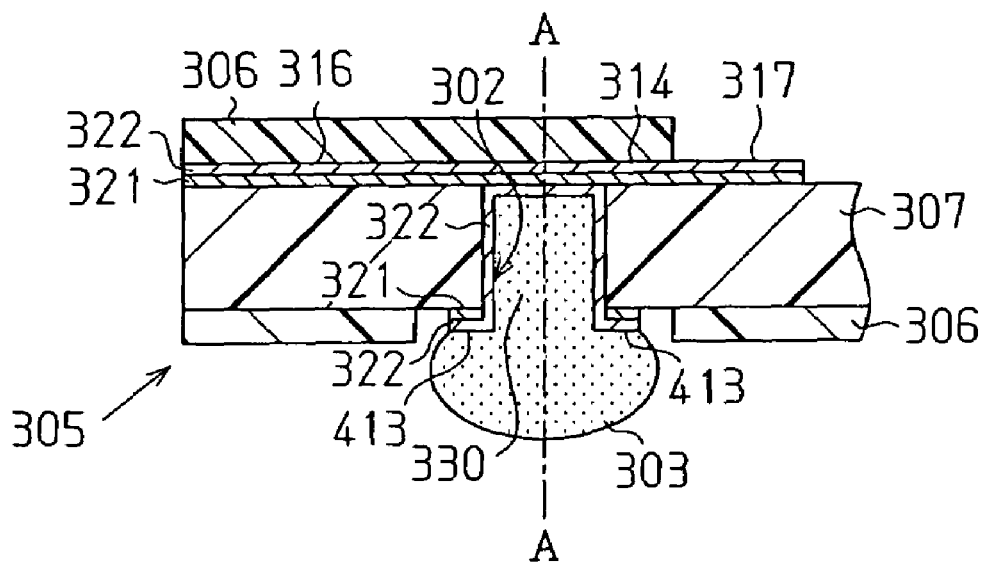
FIG. 38 is a cross-sectional view showing the pertinent portion of the printed wiring board according to a ninth embodiment of the invention.

The printed wiring board 305 of this embodiment is provided with an annular pad 313 along the peripheral edge of one opening of each interconnecting through hole 302, and a solder ball 303 is bonded onto the surface of the pad 313, as shown in FIG. 38.

That is, one opening of each interconnecting through hole 302 remains open and has an annular pad 413 applied along the peripheral edge. Meanwhile, the other opening of the interconnecting through hole 302 is covered with a covering pad 314. The covering pad 314 is connected to a conductor circuit 316.

The solder ball 303 is aligned with the central axis A of the interconnecting through hole 302. The interconnecting through hole 302 is filled with a solder 330 at a lower part of the solder ball 303. The solder 330 is formed by a part of the solder ball 303 melted to flow into the interconnecting through hole 302, when it is fused onto the annular pad 313.

The interconnecting through hole 302 is preferably filled completely with the solder 330. Thus, electrical continuity can be secured between the upper side and lower side of the interconnecting through hole 302. In order to fill the solder 330 throughout the interconnecting through hole 302, it is convenient to apply a flux onto the metal plating film 321 formed on the wall of the interconnecting through hole 302 or apply a solder paste on the wall of the interconnecting through hole 302 before the solder ball 303 is fused with heating. The surface of the insulating substrate 307 is covered with a solder resist 306. The other constitutions are the same as those in the fifth embodiment.

In this embodiment, since an annular pad 413 is provided along the peripheral edge of one opening of each interconnecting through hole 302, and a solder ball 303 is bonded onto the surface of the annular pad 313, the solder ball 303 can be substantially aligned with the interconnecting through hole 302. Accordingly, the area necessary for the interconnecting through holes 302 and the area necessary for bonding solder balls 303 coincide with each other, achieving formation of interconnecting through holes and solder balls with high density.

Further, since the area to be occupied by the interconnecting through holes 302 and the solder balls 303 is reduced to afford extra spaces on the surface of the insulating substrate 307, conductor circuits, etc. can be formed on such extra spaces, enabling high densification of surface packaging on the printed wiring board.

Furthermore, the solder 330, which is embedded in the interconnecting through hole 302 as a part of the solder ball 303, provides high reliability in the electrical continuity between the interconnecting through hole 302 and the solder ball 303.

The same other effects as in the fifth embodiment can be obtained.

Tenth Embodiment

Tenth embodiment is an embodiment of the fifth aspect of the invention.

Figure 39:
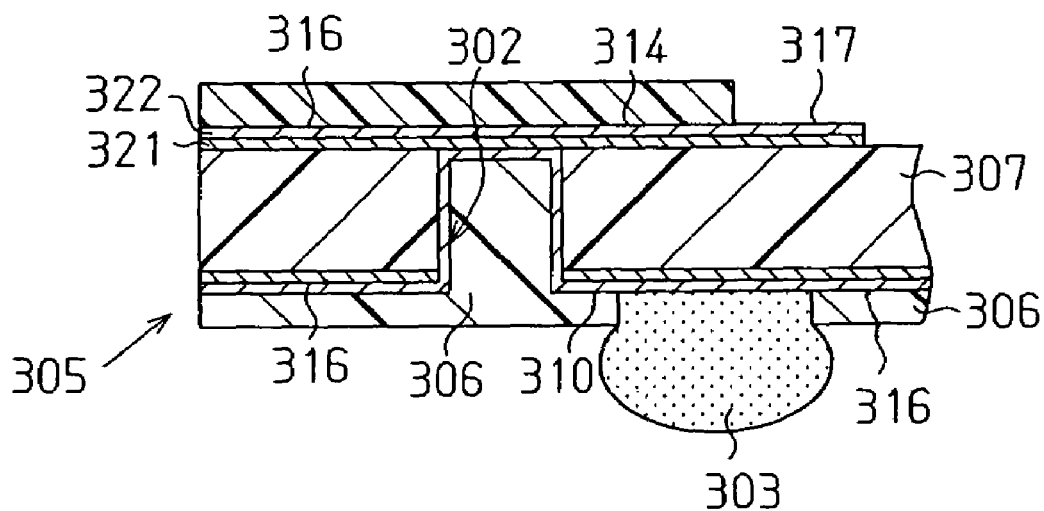
FIG. 39 is a cross-sectional view showing the pertinent portion of the printed wiring board according to a tenth embodiment of the invention.

In the printed wiring board 305 of this embodiment, a solder ball 303 is bonded at a position adjacent to each interconnecting through hole 302, as shown in FIG. 39.

Figure 40:
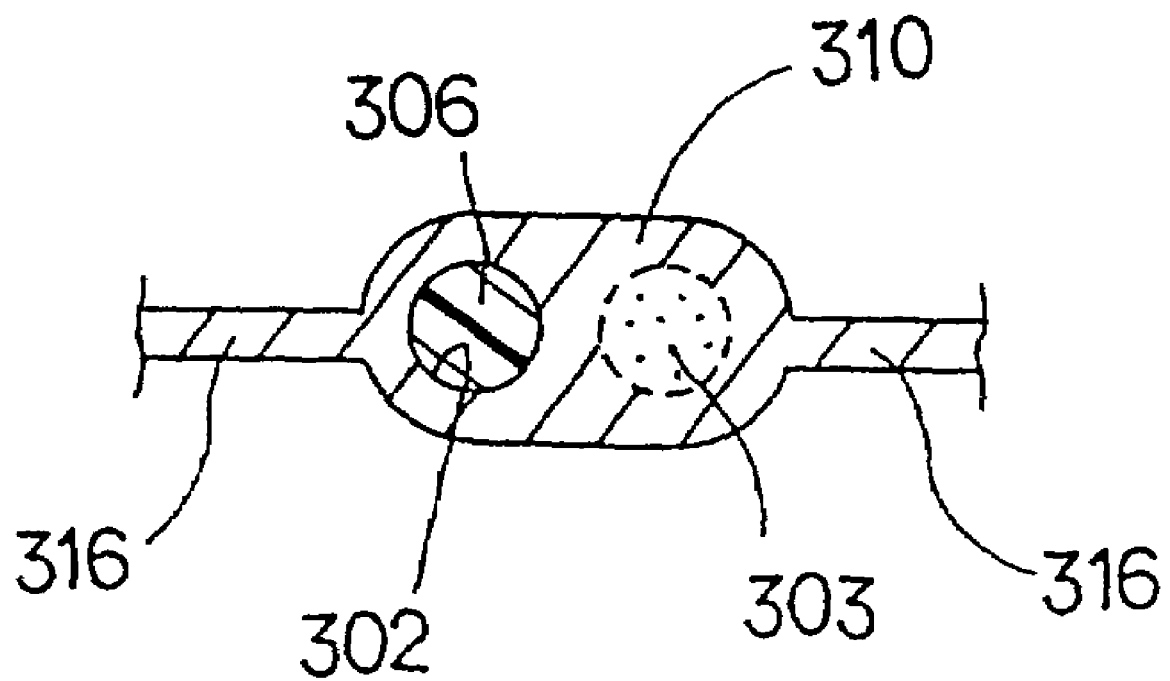
FIG. 40 is an explanatory drawing showing an annular pad in the tenth embodiment.

An oblong annular pad 310 is provided along the peripheral edge of one opening of each interconnecting through hole 302, as shown in FIG. 40. A solder ball 303 is bonded onto the surface of this annular pad 310 at a position offset from the central axis of the interconnecting through hole 302.

The other constitutions are the same as those in the fifth embodiment.

Since the solder ball 303 is located at a position offset from the central axis of each interconnecting through hole 302 in this embodiment, a larger area is necessary for bonding solder balls and for forming interconnecting through holes 302 than in the ninth embodiment.

However, since each solder ball 303 is bonded to a part of the annular pad 310 provided along the peripheral edge of the opening of each interconnecting through hole 302, in this embodiment, there is no need of forming the solder ball bonding areas and interconnecting through hole forming areas independently unlike the prior art. Therefore, according to the present invention, not only high-density packaging of interconnecting through holes and solder balls but also high-density wiring on the surface of the printed wiring board can be realized compared with the prior art.

The tenth embodiments exhibits the same other effects as in the ninth embodiment.

Eleventh Embodiment

The eleventh embodiment is an embodiment of the fifth aspect of the invention.

Figure 41:
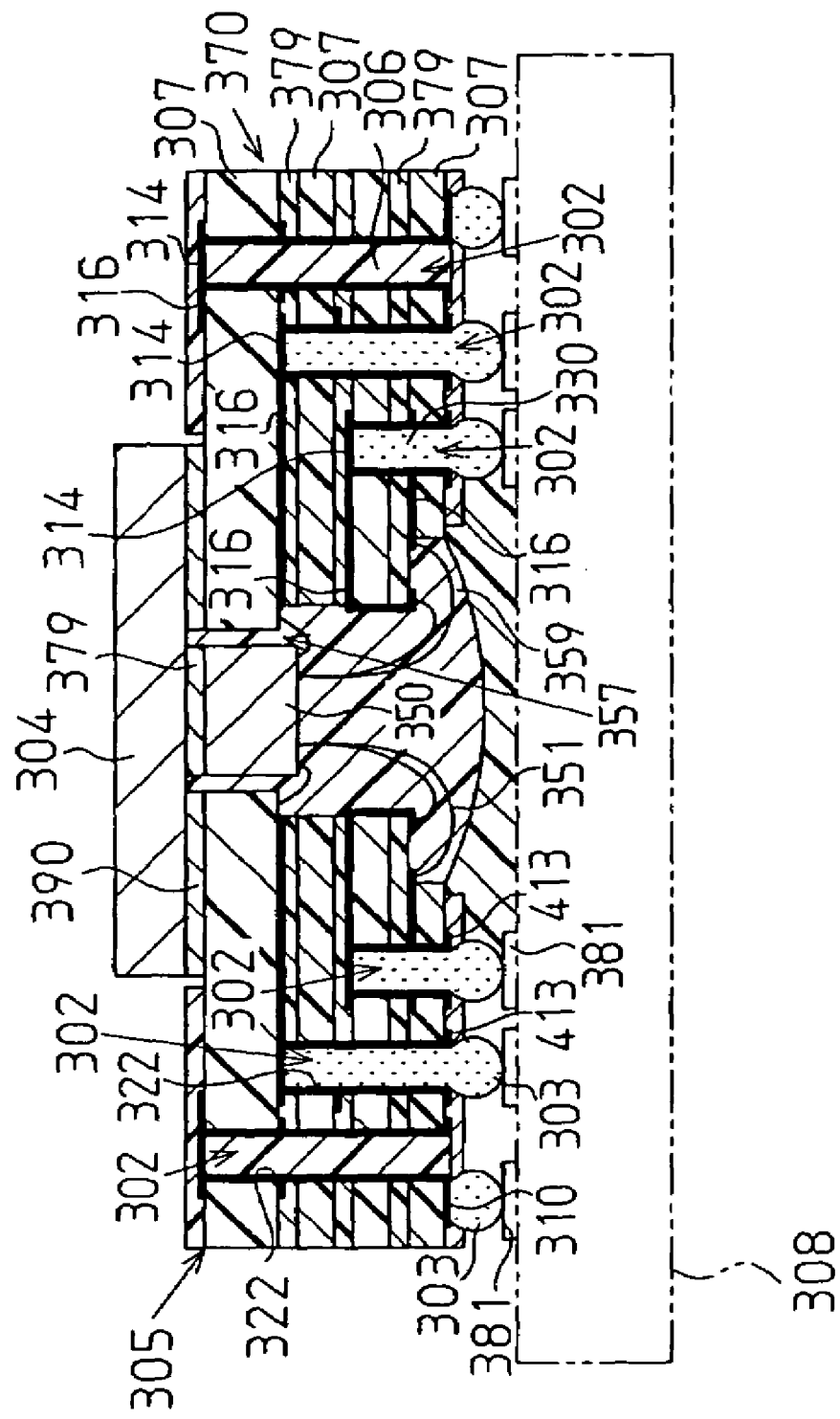
FIG. 41 is a cross-sectional view of the multilayer printed wiring board according to an eleventh embodiment of the invention.
Figure 42:
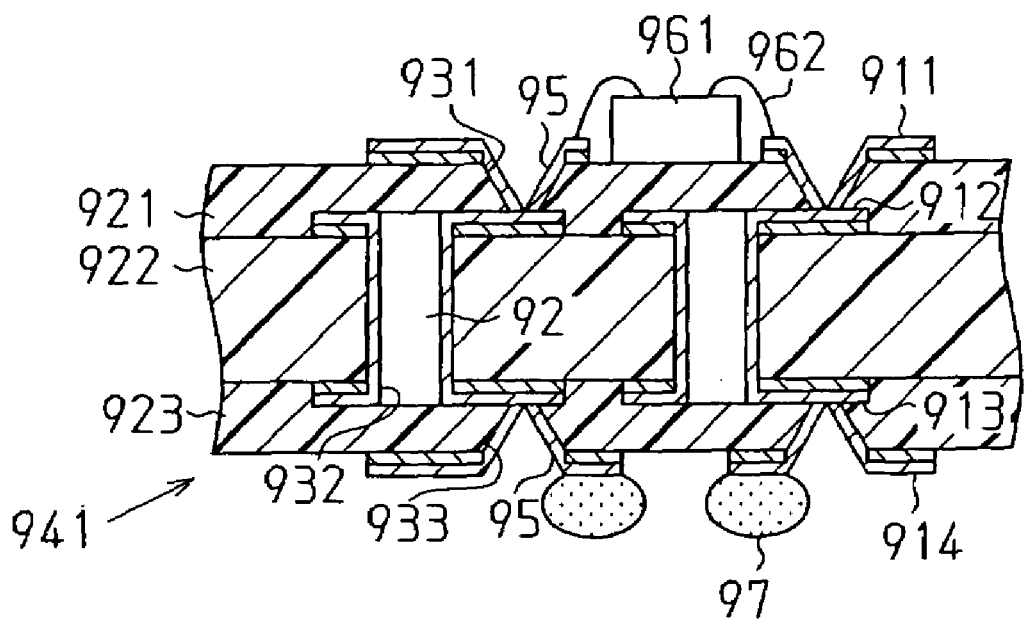
FIG. 42 is a cross-sectional view of the printed wiring board of the prior art having an even number of conductive layers.
Figure 43:
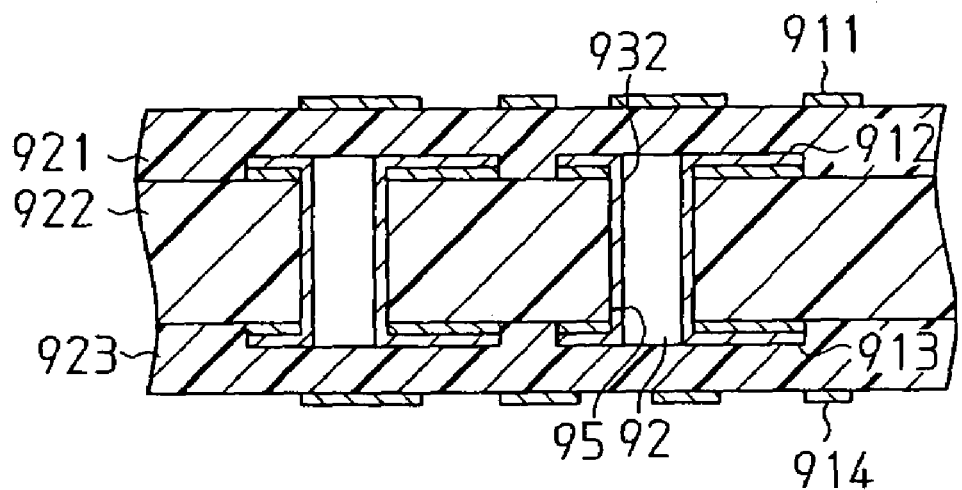
FIG. 43 is an explanatory drawing illustrating the process of manufacturing the printed wiring board of the prior art so as to show a method of forming a conductive layer as the outermost layer.
Figure 44:
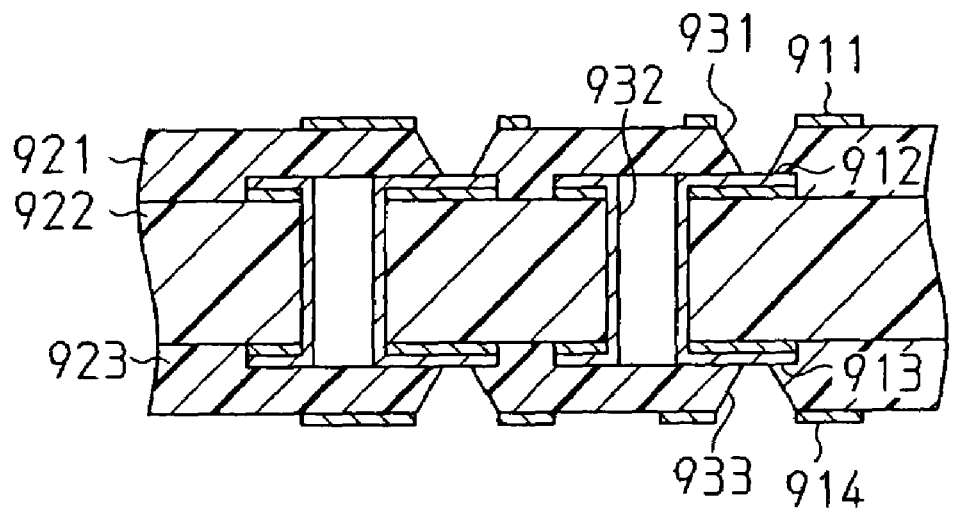
FIG. 44 is an explanatory drawing continuing from FIG. 43 illustrating a method of forming interconnecting through holes.
Figure 45:
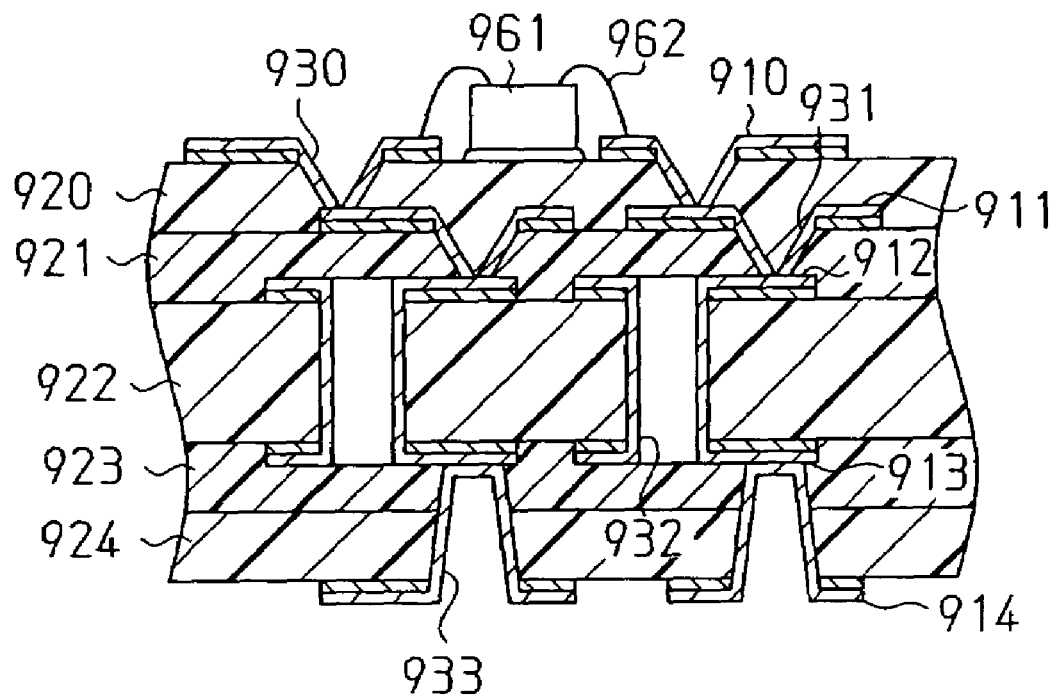
FIG. 45 is a cross-sectional view of the printed wiring board of the prior art having an odd number of conductive layers.
Figure 46:
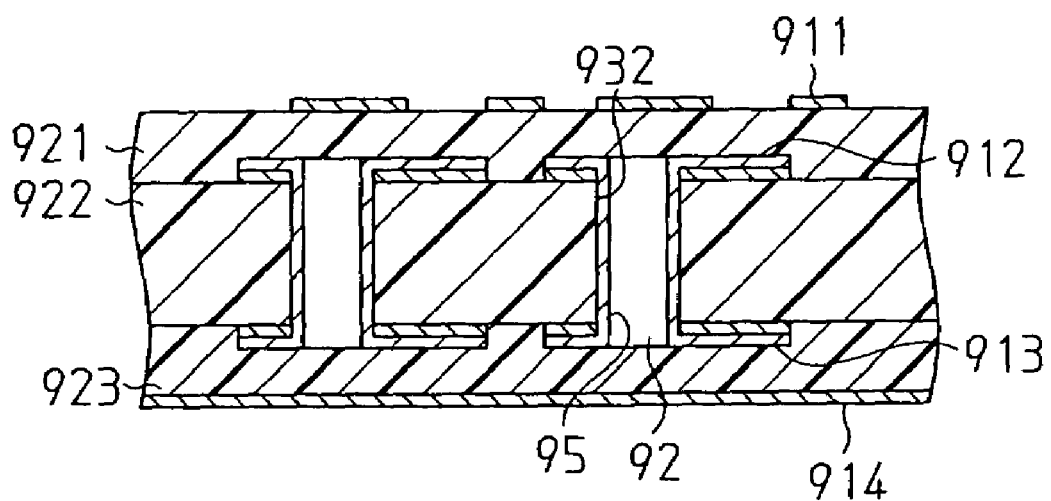
FIG. 46 is an explanatory drawing illustrating the method of manufacturing the printed wiring board of the prior art having an odd number of conductive layers, in which second to fifth conductive layers are formed.
Figure 47:
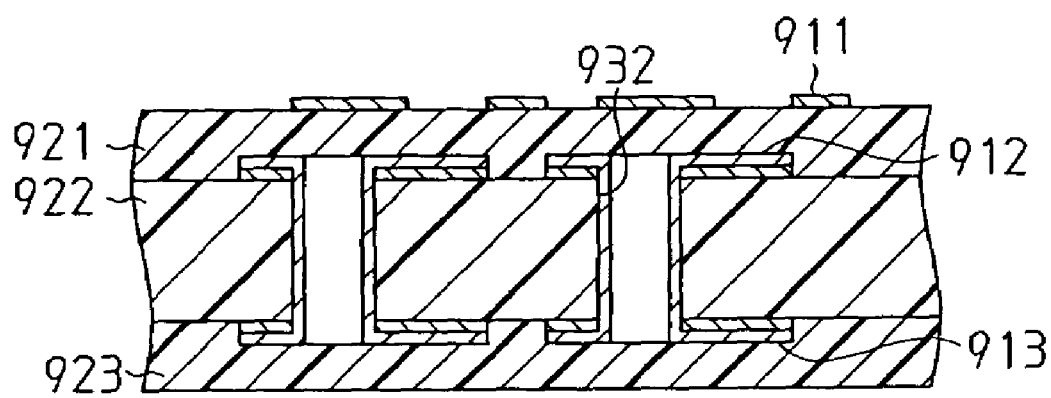
FIG. 47 is an explanatory drawing continuing from FIG. 46 showing the insulating layer exposed by removing the fifth conductive layer.
Figure 48:
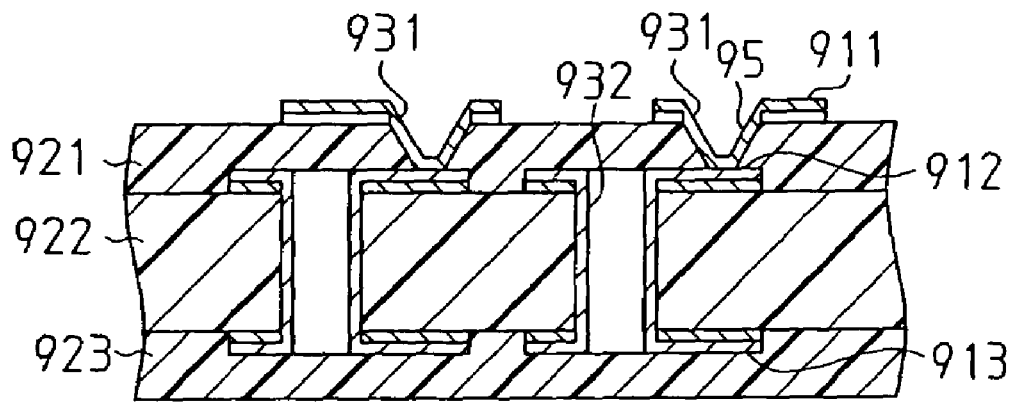
FIG. 48 is an explanatory drawing continuing from FIG. 47 showing the insulating layer in which interconnecting through holes are defined in the second insulating layer.
Figure 49:
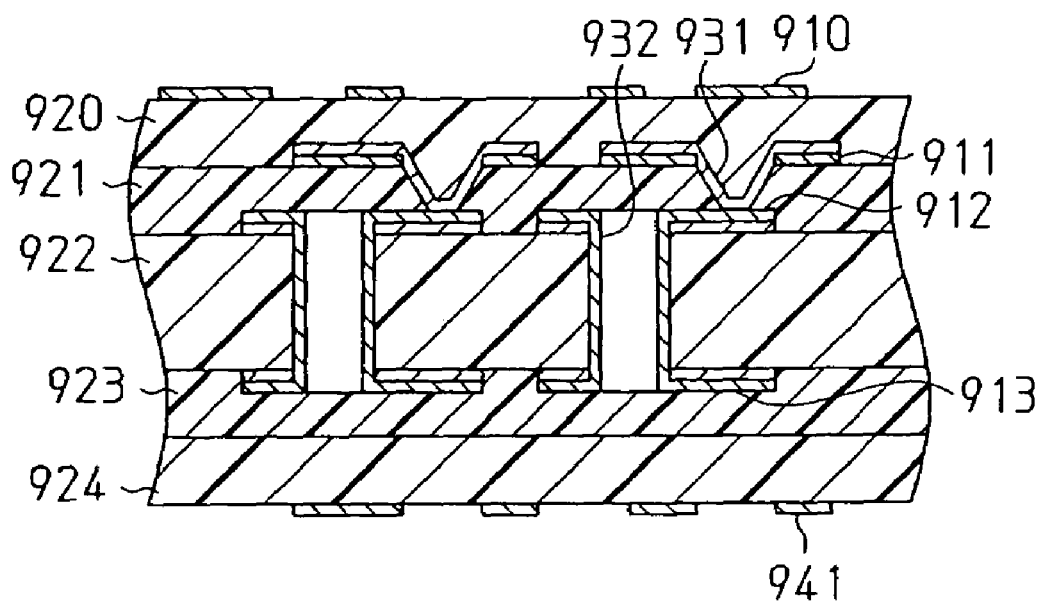
FIG. 49 is an explanatory drawing continuing from FIG. 48 showing the insulating layers having first to fifth conductive layers respectively.
Figure 50:
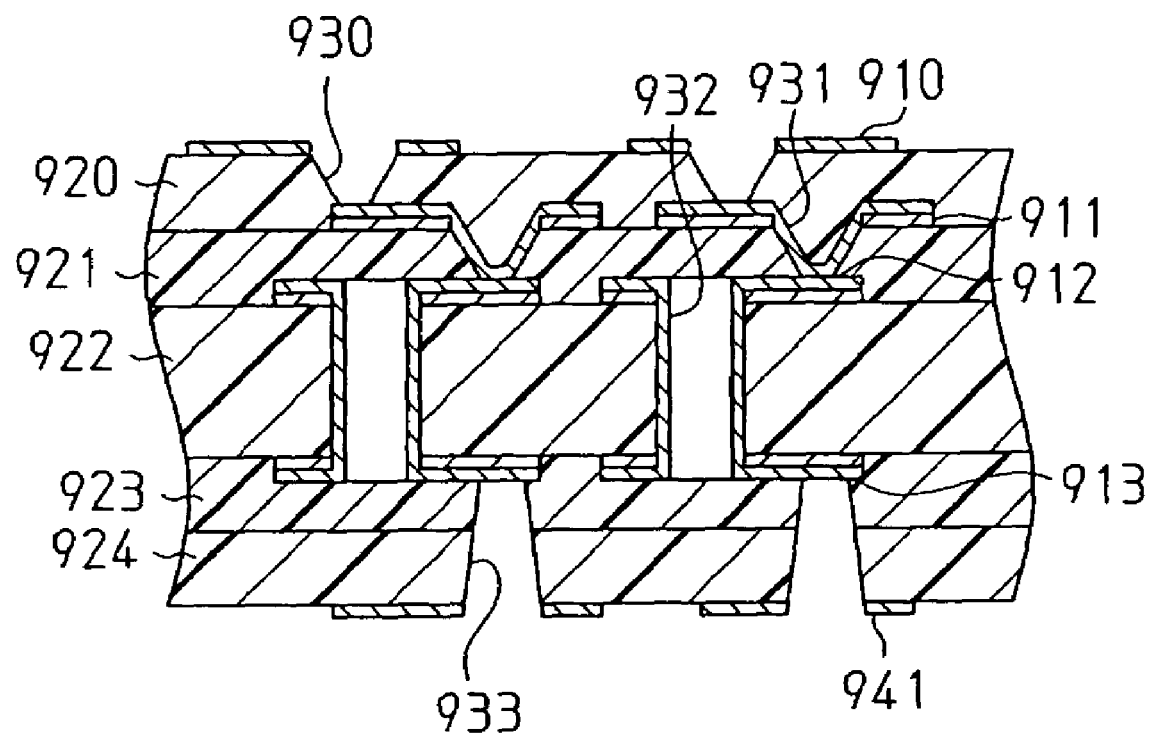
FIG. 50 is an explanatory drawing continuing from FIG. 49 showing the insulating layers having interconnecting through holes formed through the outermost insulating layer.
Figure 51:
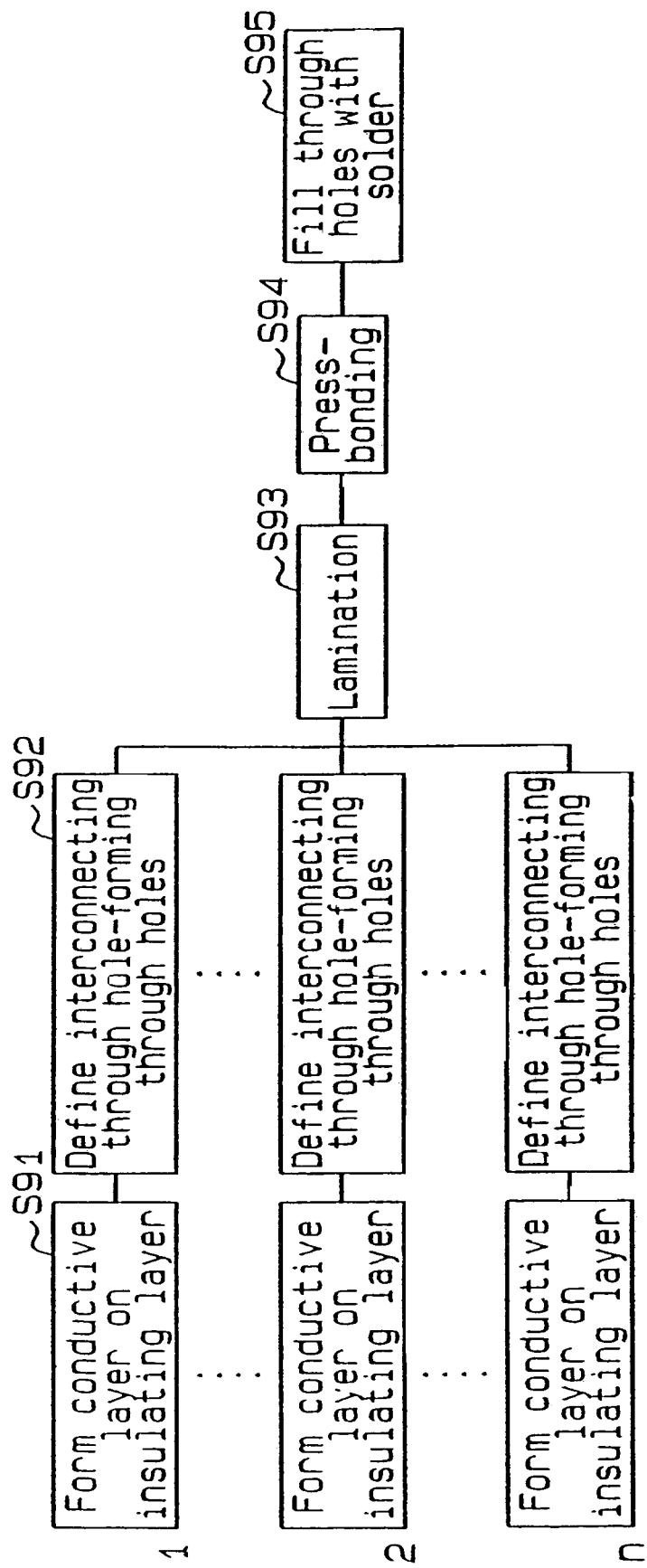
FIG. 51 is an explanatory drawing showing the process of manufacturing the printed wiring board according to another example of the prior art.

The printed wiring board 305 of this embodiment is a multilayer substrate 370 comprising laminating a plurality of insulating substrates 307, as shown in FIG. 41.

The printed wiring board 305 has interconnecting through holes 302, some of which penetrate all of the insulating substrates 307 and some of which do not, for electrically connecting the layers of the multilayer substrate 370. The openings of the interconnecting through holes 302 on one side of the wiring board 305 remain open and are provided with annular pads 413 and 310 having different shapes, respectively. The openings of the interconnecting through holes 302 on the other side of the wiring board 305 are covered with covering pads 314. The covering pads 314 are connected to conductor circuits 316 respectively.

The annular pads 413 and 310 are electrically connected to the covering pads 314 through the metal plating films 322 covering the walls of the interconnecting through holes 302. Solder balls 303 to be connected to pads 381 of a mother board 308 and the like are bonded onto the surfaces of the a annular pads 413 and 310, respectively.

A solder ball 303 is bonded onto the surface of each annular pad 413 in alignment with the central axis A of each interconnecting through hole 302 (see FIG. 38). Meanwhile, solder balls 303 are bonded onto the surfaces of other annular pads 310 at positions offset from the central axes of the interconnecting through holes 302 and not overlapping with the through holes 302, respectively, i.e., at positions adjacent to the interconnecting through holes 302 (see FIGS. 39 and 40).

A heat-radiating plate 304 is bonded with a bonding material 390 such as a prepreg onto the other side of the multilayer substrate 370 across from the side on which the solder balls 303 are bonded. The heat-radiating plate 304 covers a mounting hole 357 defined stepwise in the multilayer substrate 370 and has on its surface an electronic component 350 adhered using a bonding agent 379 such as a solder paste.

The other constitutions are the same as those in the eighth embodiment.

In this embodiment, the multilayer substrate formed by laminating a plurality of insulating substrates 307 contains interconnecting through holes 302 for electrically connecting the layers. Accordingly, high-density packaging of conductor circuits 316, interconnecting through holes 302 and solder balls 303 can be realized like in the ninth embodiment.

INDUSTRIAL APPLICABILITY

The present invention provides a printed wiring board and a method for manufacturing the same which improves electrical properties of multilayer printed wiring boards. Particularly, the present invention is capable of:

(1) building up an odd number of conductive layers efficiently with no warping;

(2) controlling interlayer delamination;

(3) forming interconnecting through holes at accurate positions; and (4) transferring a large amount of electrical information in and out of the printed wiring board through the solder balls for external connection and achieving high densification of surface packaging.

The invention claimed is:

1. A printed wiring board comprising n conductive layers and n insulating layers, wherein said n conductive layers and said n insulating layers are interleaved wherein the conductive layers are electrically connected to one another via first and second through holes, wherein n is an odd number;

wherein a first of said conductive layers is a layer on which an electronic component is to be mounted with leads for electric currents in and out of the electronic component; an n-th one of said conductive layers is an external connecting layer for connecting external connecting terminals which conduct electric currents in and out of the printed wiring board; a second to an (n−1)-th ones of said conductive layers are current transmitting layers for transmitting internal currents of the printed wiring board; each of a first to an (n−1)-th ones of said insulating layers, except for the (n+1)/2-th insulating layer, has at least one of the first through holes with a plating film formed on a wall thereof to connect the conductive layers; and a surface of the n-th conductive layer is covered with an n-th and outermost one of the insulating layers wherein a central ((n+1)/2-th) insulating layer has the second through holes, each of the second through holes having a plating film formed on a wall thereof, said plating film extending to the ones of the conductive layers adjacent the central insulating layer and connecting to a first through hole, whereby warping is prevented from occurring in the printed wiring board.

2. The printing wiring board according to claim 1, wherein the external connecting terminals are solder balls.

3. The printed wiring board according to claim 1, wherein each of the insulating layers is formed of one of epoxy resins, phenol resins, polyimide resins, polybutadiene resins, and fluororesins.

4. A method of manufacturing a printed wiring board having an odd number n of conductive layers interleaved with n insulating layers and are electrically connected to one another by first, second, and third interconnecting through holes, wherein a central ((n+1)/2-th) insulating layer has the second through holes, and each of the second through holes has a plating film formed on a wall thereof, said plating film extending to the ones of the conductive layers adjacent the central insulating layer, the method comprising the steps of:

interposing the insulating layers between a second to an n-th conductive layer and forming the first interconnecting through holes for electrically connecting the conductive layers to one another;

laminating a first prepreg and a copper foil on a surface of the second conductive layer, laminating a second prepreg on a surface of the n-th conductive layer, and simultaneously press-bonding the first and second prepregs, the copper foil, the second to n-th conductive layers, and the insulating layers to form a multilayer substrate having n insulating layers, wherein the second to n-th conductive layers are internal layers of the multilayer substrate;

etching the copper foil to form a first conductive layer;

forming the third interconnecting through holes in a first insulating layer and forming connecting holes in an n-th insulating layer respectively;

forming a metal plating film on the walls of the third interconnecting through holes of the first insulating layer for electrically connecting the first conductive layer with a second conductive layer and connecting external connecting terminals to a surface of the n-th conductive layer exposed through the first connecting through holes of the n-th insulating layer.

5. The method according to claim 4, wherein each of the insulating layers is formed of one of epoxy resins, phenol resins, polyimide resins, polybutadiene resins, and fluororesins.

6. A printed wiring board comprising:

an insulating substrate having at least one interconnecting through hole penetrating the insulating substrate and having a first opening and a second opening;

an annular pad disposed along a peripheral edge of the first opening of the interconnecting through hole so as not to cover the first opening;

a covering pad covering the second opening of the interconnecting through hole;

a conductor circuit connecting an electronic component with the covering pad;

a metal plating film electrically connecting the annular pad and the covering pad, the metal plating film covering a wall of the interconnecting through hole and the bottom of the interconnecting through hole defined by the covering pad such that the metal plating film has a flat surface at the wall and the bottom of the interconnecting through hole; and a solder ball for external connection bonded to the annular pad at a position offset from the interconnecting through hole.

7. The printed wiring board according to claim 6, wherein the surface of the insulating substrate is covered with a solder resist.

8. The printed wiring board according to claim 6, wherein the solder ball is located in alignment with the interconnecting through hole.

9. The printed wiring board according to claim 6, wherein the solder ball is located at a position offset from the interconnecting through hole.

* * * * *